United States Patent
Kumagai et al.

(12) 
(10) Patent No.: US 6,208,171 B1
(45) Date of Patent: Mar. 27, 2001

(54) SEMICONDUCTOR INTEGRATED CIRCUIT DEVICE WITH LOW POWER CONSUMPTION AND SIMPLE MANUFACTURING STEPS

(75) Inventors: Kouichi Kumagai; Susumu Kurosawa, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/294,089

(22) Filed: Apr. 19, 1999

(30) Foreign Application Priority Data

Apr. 20, 1998 (JP) .................................................. 10-108947

(51) Int. Cl.[7] .......................... H03K 19/20; H03K 19/094
(52) U.S. Cl. ............................................. 326/121; 326/83
(58) Field of Search ................................. 326/68, 56, 83, 326/121, 33; 323/312

(56) References Cited

U.S. PATENT DOCUMENTS

| | | | |
|---|---|---|---|
| 4,527,077 | * | 7/1985 | Higuchi et al. ....................... 307/443 |
| 4,843,261 | * | 6/1989 | Chappell et al. ..................... 307/449 |
| 4,931,668 | * | 6/1990 | Kikuda et al. ........................ 307/443 |
| 5,218,247 | * | 6/1993 | Ito et al. .............................. 307/475 |
| 5,352,939 | * | 10/1994 | Hirabayashi et al. ............... 307/443 |
| 5,583,457 | * | 12/1996 | Horiguchi et al. ................... 326/121 |
| 5,726,562 | * | 3/1998 | Mizuno ................................ 323/312 |
| 5,821,777 | * | 10/1998 | Tanoi .................................... 326/56 |
| 5,828,235 | * | 10/1998 | Horiguchi et al. ................... 326/121 |
| 5,880,604 | * | 3/1999 | Kawahara et al. ..................... 326/83 |

FOREIGN PATENT DOCUMENTS

| | | |
|---|---|---|
| 6-29834 | 2/1994 | (JP) . |
| 6-237164 | 8/1994 | (JP) . |
| 11-214962 | 8/1999 | (JP) . |

OTHER PUBLICATIONS

Shigematsu, et al.; A 1–V High–Speed MTCMOS Circuit Scheme for Power–Down Applications; *1995 Symposium on VLSI Circuits Digest of Technical Papers*; pp. 125–126.

Japanese Office Action dated Sep. 27, 2000, with partial translation.

* cited by examiner

*Primary Examiner*—Michael Tokar
*Assistant Examiner*—Steven S. Paik
(74) *Attorney, Agent, or Firm*—McGinn & Gibb, PLLC

(57) ABSTRACT

In a semiconductor integrated circuit, a control transistor 4 and a potential clamp circuit 9 are arranged between a power supply line 2 and a virtual power supply line 3. Even in a sleeve mode where the control transistor 4 is turned off, the potential clamp circuit 9-1 clamps the virtual power supply line 3 at a certain potential to hold a potential state (high level or low level) of each node of a logical circuit. At this time, each FET forming the logical circuit is applied with a back bias so that a threshold voltage Vt becomes higher than that in an active mode. Therefore, a leakage current can be decreased. In the semiconductor integrated circuit, the threshold voltage Vt of the control transistor 4 can be selected to be equal to that of one FET of the complementary FET forming the logical circuit. Therefore, the layout area and the number of manufacturing steps can be reduced.

5 Claims, 16 Drawing Sheets

SEMICONDUCTOR INTEGRATED CIRCUIT DEVICE WITH LOW POWER CONSUMPTION AND SIMPLE MANUFACTURING STEPS

BACKGROUND OF THE INVENTION

This invention relates to a semiconductor integrated circuit comprising low-threshold complementary MIS (Metal Insulator Semiconductor) field effect transistors and, in particular, to a circuit structure intended for reduced power consumption in a sleep mode.

In a recent complementary MIS (Metal Insulator Semiconductor) logical LSI (Large-Scale Integrated circuit), each of MIS field effect transistors is reduced in gate length (L) so as to achieve an improvement in drivability of the transistor. Thus, an LSI chip having a high operation speed and a highly integrated structure is realized. With the reduction of the gate length (L), an operating source voltage is lowered in order to assure breakdown voltage and reliability of the transistor and to suppress the increase in power consumption of the whole chip due to the increase in device density.

Such a low source voltage results in a low operation speed of the logical circuit. Taking this into account, each of the field effect transistors (hereinafter abbreviated to FETs) forming the logical circuit is given a low-threshold voltage (Vt) whose absolute value (|Vt|) is small in conformity with the low source voltage. In this manner, the improvement in performance of the logical circuit is pursued in correspondence to scaling of the gate length (L).

However, such a MISFET having a low-threshold voltage (Vt) suffers an increase in leakage current (hereinafter called off current) while the FET is nonconductive. Therefore, in total power consumption of the logical circuit in an active mode and a sleep mode, the power consumption in the sleep mode tends to increase.

Referring to FIG. 1, consideration will be made about a P-channel MOS (Metal Oxide Semiconductor) FET (PMUS in the figure) and an N-channel MOSFET (NMOS in the figure) each of which has a gate length (L) of 0.25 μm and an absolute threshold voltage (|Vt|) of 0.2V. When a gate width (W) is equal to 50 μm, the off current (|Ioff|) on the order of 10 nA (=10$^{-8}$ A) flows in each of the P-channel MOSFET (PMOS) and the N-channel MOSFET (NMOS). As seen from FIG. 1, the off current (|Ioff|) is reduced when a backgate bias voltage (|Vbs|) is increased. In FIG. 1, an abscissa and an ordinate represent the backgate bias voltage (|Vbs|) and the off current (|Ioff|, respectively. It is assumed that a static leakage current of the whole chip has an upper limit of 1 μA. In this event, the degree of integration of the transistors in the single chip is restricted within a range such that the total gate width of the transistors in an off state does not exceed 50 mm. Thus, with the increase in off current of the FETs following the reduction in gate length, the static leakage current of the whole chip becomes a factor determining the degree of integration of the transistors at a chip level. Since the value of the off current per unit gate width will hereafter be further increased following the reduction in gate length, it is predicted that the degree of integration of the FETs can not be increased in conformity with the scaling of the gate length (L).

Referring to FIG. 2, a semiconductor integrated circuit has a circuit structure intended for reduced power consumption of a logical circuit using low-threshold (Vt) transistors in a sleep mode. Such a semiconductor integrated circuit is disclosed, for example, in Japanese Unexamined Patent Publication (JP-A) No. 6-29834 (29834/1994). As illustrated in FIG. 2, a first power supply circuit comprises a high-threshold control transistor 16 arranged between a power supply line (VDD) 2 connected to a power supply 1 and a virtual or auxiliary power supply line (VVD) 3. On the other hand, a second power supply circuit comprises a high-threshold control transistor 17 arranged between a grounding line (GND) 6 and a virtual or auxiliary grounding line (VGD) 7 connected to the ground 5. A low-threshold logical circuit 15 has one power supply terminal connected to the virtual power supply line (VVD) 3 and the other power supply terminal connected to the virtual grounding line (VGD) 7. In order to stabilize electric potentials of the power supply lines and the grounding lines, capacitors 18-1 and 18-2 are connected between the power supply line (VDD) 2 and the virtual power supply line (VVD) 3 and between the grounding line (GND) 6 and the virtual grounding line (VGD) 7, respectively.

In the circuit structure illustrated in FIG. 2, the low-threshold logical circuit 15 is electrically fed from the power supply 1 through the high-threshold control transistors 16 and 17. In case of the above-mentioned MOSFETs having the gate length (L) of 0.25 μm, the off current (|Ioff|) at the gate width (W) of 50 μm can be reduced to a level on the order of 1 pA if the threshold voltage (Vt) of each of the high-threshold control transistors 16 and 17 is selected to be equal to 0.5 V. In the circuit structure of FIG. 2, the high-threshold control transistors 16 and 17 are turned off in the sleep mode (CS=low level, CSB=high level) to suppress a leakage current between the power supply 1 and the ground 5 to a low level. Thus, the power consumption in the sleep mode can be sufficiently suppressed as compared with that in an active mode.

In the above-mentioned circuit structure, however, it is required that at least one of the PMOS and the NMOS has two different threshold voltages (Vt), i.e., a high-threshold voltage and a low-threshold voltage. This results in increase in number of manufacturing steps.

On the other hand, each of the control transistors must have an ability of supplying an electric current necessary for the low-threshold logical circuit to operate at a desired operation speed under a low source-drain voltage (Vds). In the circuit structure mentioned above, high-threshold transistors sufficiently low in off current are used as the control transistors 16 and 17. In this event, each of the control transistors 16 and 17 must have a greater gate width as compared with the case where low-threshold transistors are used. This results in an unfavorable increase in layout area.

Referring to FIG. 3, another semiconductor integrated circuit with a power supply arrangement of the type illustrated in FIG. 2 is capable of holding information or data even in the sleep mode. This circuit is disclosed in S. Shigematsu et al "A 1-V High-speed MTCMOS circuit scheme for power-down applications", 1995 Symposium on VLSI Circuits Digest of Technical Papers, pages 125 and 126.

Referring to FIG. 3, connection between the low-threshold logical circuit 15 and the power supply circuits is similar to that described in conjunction with FIG. 2. In order to hold the data in an internal node (DATA) of the low-threshold logical circuit 15 even in the sleep mode, the low-threshold logical circuit 15 is connected to a latch circuit 19. The latch circuit 19 illustrated in FIG. 3 includes first and second inverters INV1 and INV2 comprising high-threshold transistors, and first and second transfer gates TG1 and TG2.

Referring to FIG. 4 in addition to FIG. 3, switching of the active mode and the sleep mode and a latching operation will be described.

In FIG. 4, the low-threshold logical circuit 15 and the latch circuit 19 are operated in the following manner.

In a first time interval T1, a normal operation is carried out. Both of the transfer gates TG1 and TG2 are turned off.

In a second time interval T2, the transfer gate TG1 is turned on while the transfer gate TG2 is turned off. The data in the DATA node in FIG. 3 is propagated into the latch circuit 19.

In a third time interval T3 which is a period in a sleep mode, the transfer gate TG1 is turned off while the transfer gate TG2 is turned on. The data held in the DATA node immediately before switching into the sleep mode is latched in the latch circuit 19.

In a fourth time interval T4, both of the transfer gates TG1 and TG2 are turned on. The data held in the latch circuit 19 are propagated into the low-threshold logical, circuit 15.

Thus, in the previous technique, the latch circuit as a data holding circuit for holding the data in the sleep mode is required in addition to the logical circuit. This brings about an increase in layout area. In addition, the operation of the data holding circuit is complicated as described in conjunction with FIG. 4. As compared with the case where the power supply arrangement in FIG. 2 is not used, the man-hour required in circuit design is increased.

Thus, these CMOS integrated circuits are disadvantageous in the following respects.

As a first disadvantage, the number of manufacturing steps and the production cost are increased.

This is because additional steps are required to set two kinds of threshold voltages, i.e., high and low threshold voltages. In order to set the threshold voltages, impurities are ion-implanted into a channel region of the MOSFET. In this event, two additional patterns are additionally required to set the high and low threshold voltages for each of the P-channel and the N-channel MOSFETs.

As a second disadvantage, the layout area of the control transistor in the power supply circuit is increased.

This is because, since the high-threshold transistor whose off current is sufficiently low is used as the control transistor of the power supply circuit, the gate width is great as compared with the case where the low-threshold transistor is used.

As a third disadvantage, the latch circuit for holding the data in the sleep mode is required in addition to the logical circuit. This brings about an increase in layout area, complexity in layout design and timing design, and an increase in man-hour for designing.

SUMMARY OF THE INVENTION

It is therefore an object of this invention to provide a semiconductor integrated circuit which is reduced in number of manufacturing steps and production cost.

It is another object of this invention to provide a semiconductor integrated circuit in which an increase in layout area of a control transistor in a power supply circuit is suppressed.

It is still another object of this invention to provide a semiconductor integrated circuit which is capable of holding data in a sleep mode without requiring a special latch circuit.

It is yet another object of this invention to provide a semiconductor integrated circuit which has a hierarchical structure in power supply control to enable sophisticated power control.

According to a first aspect of this invention, there is provided a semiconductor integrated circuit comprising:

a logical circuit including a complementary transistor formed by a combination of P-channel and N-channel MIS (Metal Insulator Semiconductor) field-effect transistors, and first and second power supply terminals connected to the P-channel and the N-channel MIS field-effect transistors, respectively;

a power supply line connected to a power supply;

a grounding line connected to the second power supply terminal and to the ground; and a power feeding section connected to the power supply line and the logical circuit;

the P-channel MIS field-effect transistor having a substrate terminal connected to the power supply line, the N-channel MIS field-effect transistor having a substrate terminal connected to the grounding line;

the power feeding section comprising:

a virtual power supply line connected to the first power supply terminal of the logical circuit; and a power supply switching circuit connected between the power supply line and the virtual power supply line;

the power supply switching circuit comprising:

a P-channel MIS control transistor connected between the power supply line and the virtual power supply line; and a clamp circuit connected between the power supply line and the virtual power supply line to clamp, when the -control transistor is turned off, an electric potential of the virtual power supply line at a clamp potential which is lower than an electric potential of the power supply line and higher than an electric potential of the grounding line;

the clamp circuit being for making, when the control transistor is turned off, the logical circuit continuously hold the state of a logic level which an internal node of the logical circuit has immediately before the control transistor is turned off.

According to a second aspect of this invention, there is provided a semiconductor integrated circuit comprising:

a logical circuit including a complementary transistor formed by a combination of P-channel and N-channel MIS field-effect transistors, and first and second power supply terminals connected to the P-channel and the N-channel MIS field-effect transistors, respectively;

a power supply line connected to a power supply and to the first power supply terminal;

a grounding line connected to the ground; and a power feeding section connected to the logical circuit and the grounding line;

the P-channel MIS field-effect transistor having a substrate terminal connected to the power supply line, the N-channel MIS field-effect transistor having a substrate terminal connected to the grounding line;

the power feeding section comprising:

a virtual power supply line connected to the second power supply terminal of the logical circuit; and a power supply switching circuit connected between the grounding line and the virtual grounding line;

the power supply switching circuit comprising:

an N-channel MIS control transistor connected between the grounding line and the virtual grounding line; and a clamp circuit connected between the grounding line and the virtual grounding line to clamp, when the control transistor is turned off, an electric potential of the virtual grounding line at a clamp potential which is higher than an electric potential of the grounding line and lower than an electric potential of the power supply line;

the clamp circuit being for making, when the control transistor is turned off, the logical circuit continuously hold the state of a logic level which an internal node of the logical circuit has immediately before the control transistor is turned off.

According to a third aspect of this invention, there is provided a semiconductor integrated circuit comprising as a given-level circuit of a given level in a hierarchical structure:

a logical circuit including a complementary transistor formed by a combination of P-channel and N-channel MIS field-effect transistors, and first and second power supply terminals connected to the P-channel and the N-channel MIS field-effect transistors, respectively;

a power supply line connected to a power supply;

a grounding line connected to the ground; and a power feeding section connected to the power supply line and the logical circuit;

the P-channel MIS field-effect transistor having a substrate terminal connected to the power supply line, the N-channel MIS field-effect transistor having a substrate terminal connected to the grounding line;

the power feeding section comprising:

a virtual power supply line connected to the first power supply terminal of the logical circuit;

a first power supply switching circuit connected between the power supply line and the virtual power supply line;

a virtual grounding line connected to the second power supply terminal of the logical circuit; and a second power supply switching circuit connected between the grounding line and the virtual grounding line;

the first power supply switching circuit comprising:

a first control transistor of a P-channel MIS type connected between the power supply line and the virtual power supply line; and a first clamp circuit connected between the power supply line and the virtual power supply line to clamp, when the first control transistor is turned off, an electric potential of the virtual power supply line at a first clamp potential which is lower than an electric potential of the power supply line and higher than an electric potential of the grounding line;

the second power supply switching circuit comprising:

a second control transistor of an N-channel MIS type connected between the grounding line and the virtual grounding line; and a second clamp circuit connected between the grounding line and the virtual grounding line to clamp, when the second control transistor is turned off, an electric potential of the virtual grounding line at a second clamp potential which is higher than an electric potential of the grounding line and lower than the first clamp potential;

the first and the second clamp circuits being for making, when the first and the second control transistors are turned off, the logical circuit continuously hold the state of a logic level which an internal node of the logical circuit has immediately before the first and the second control transistors are turned off.

According to a fourth aspect of this invention, the semiconductor integrated circuit in the third aspect of this invention further comprises:

an upper-level circuit of an upper level;

the first control transistor of the given-level circuit being responsive to a first switching signal from the upper-level circuit to be turned off when the first switching signal has a high level;

the second control transistor of the given-level circuit being responsive to a second switching signal from the upper-level circuit to be turned off when the second switching signal has a low level.

According to a fifth aspect of this invention, the semiconductor integrated circuit in the fourth aspect of this invention further comprises:

a lower-level circuit of a lower level;

the given-level circuit comprising:

switching signal producing means for producing the first and the second switching signals;

a NOR circuit connected to the upper-level circuit and the switching signal producing means for calculating a NOR'ed result of the first switching signal supplied from the upper-level circuit and the first switching signal supplied from the switching signal producing means;

a first inverter for inverting an output signal of the NOR circuit;

a NAND circuit connected to the upper-level circuit and the switching signal producing means for calculating a NAND'ed result of the second switching signal supplied from the upper-level circuit and the second switching signal supplied from the switching signal producing means; and a second inverter for inverting an output signal of the NAND circuit;

the first inverter producing an output signal to be supplied to the lower-level circuit as the first switching signal for the lower-level circuit;

the second inverter producing an output signal to be supplied to the lower-level circuit as the second switching signal for the lower-level circuit.

Thus, in this invention, the control transistor and the potential clamp circuit are arranged between the power supply line and the virtual power supply line or between the grounding line and the virtual grounding line. It is noted here that a high-threshold transistor need not be used as the control transistor. With this structure, when the control transistor is turned off to put the logical circuit into a sleep mode, the electric potential at the power supply terminal of the logical circuit is clamped at a predetermined level.

DESCRIPTION OF THE PREFERRED EMBODIMENTS

Figure 1:
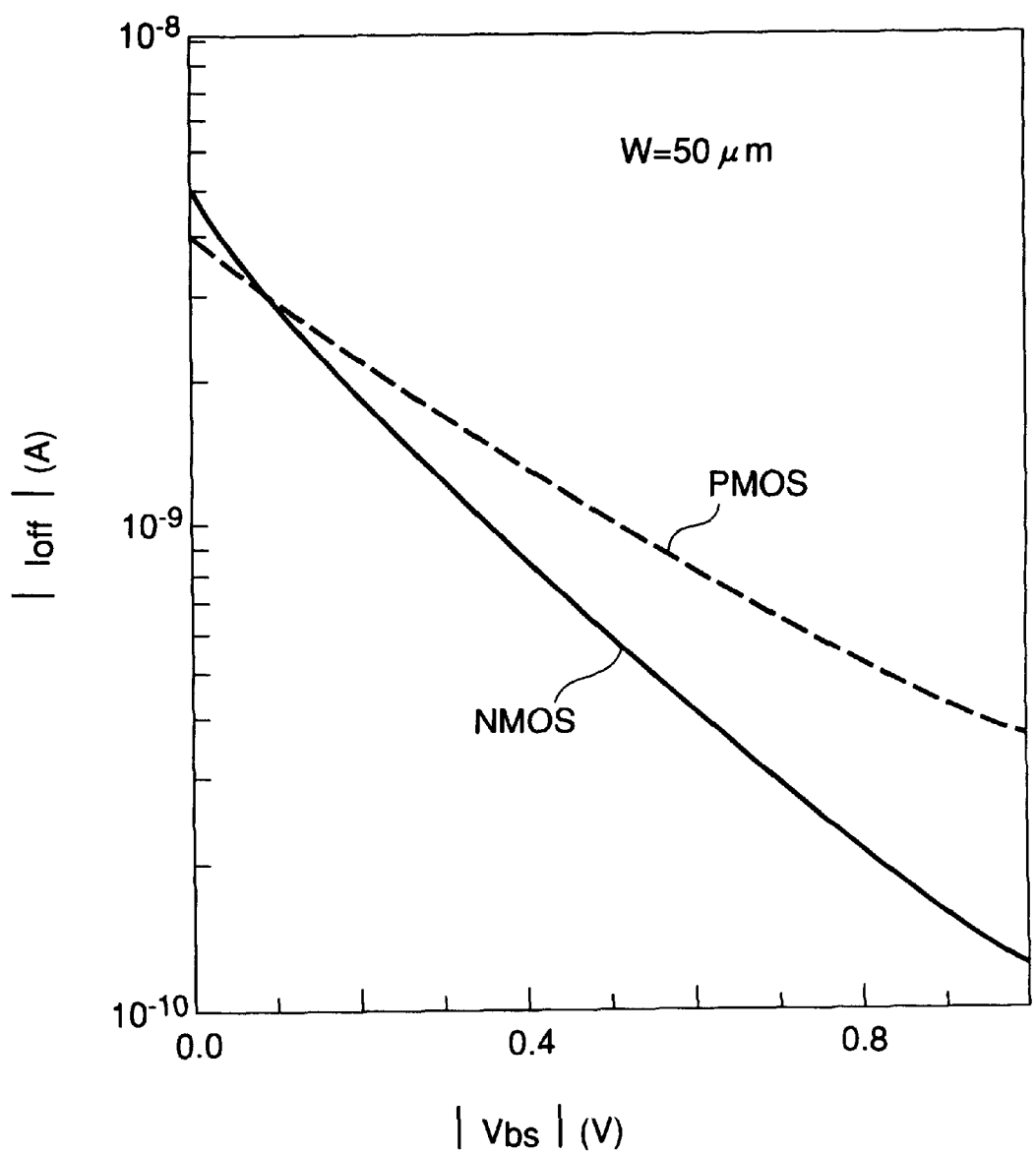
FIG. 1 is a graph showing an off current of a MOSFET having a substrate voltage dependence.
Figure 2:
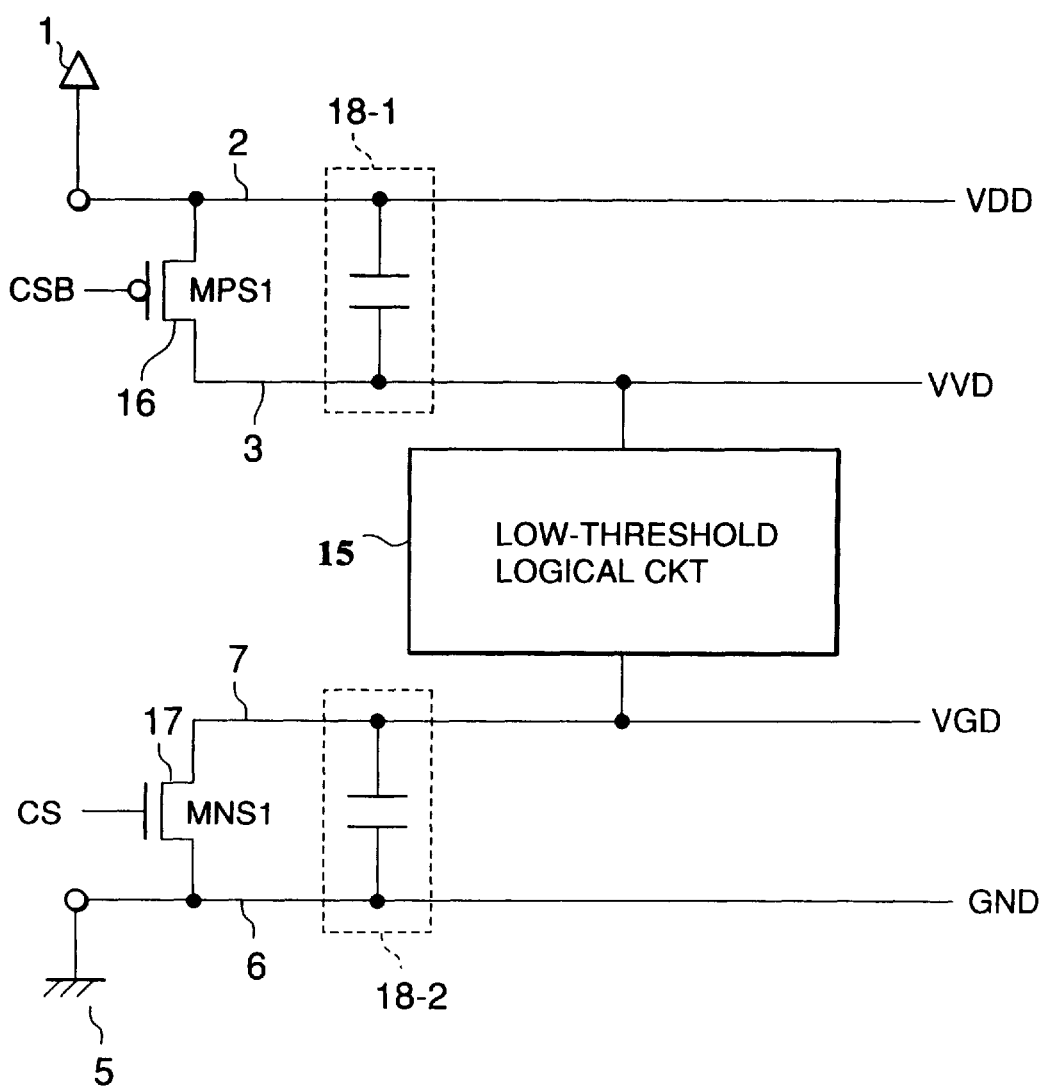
FIG. 2 shows a circuit structure of an existing semiconductor integrated circuit.
Figure 3:
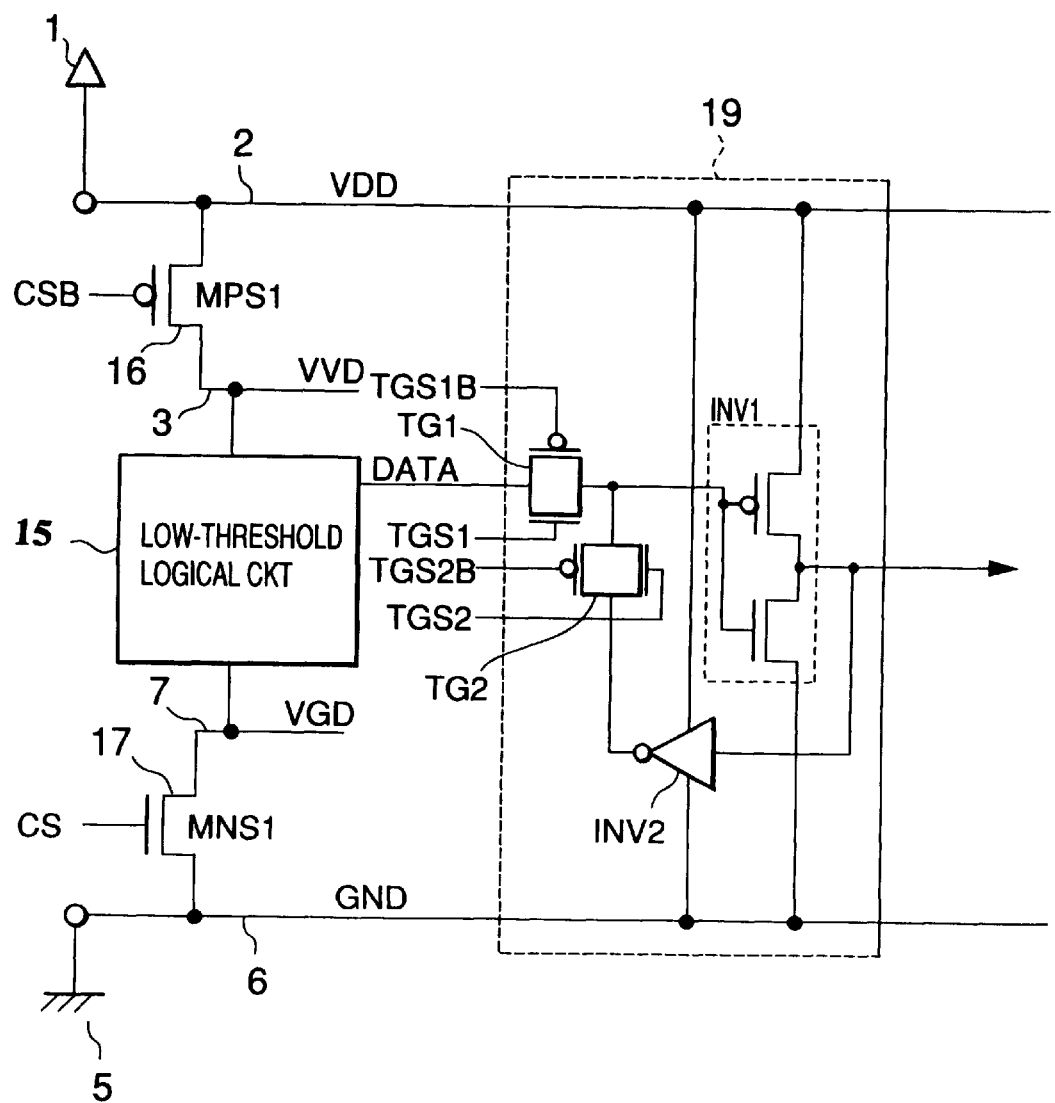
FIG. 3 shows a circuit structure of another existing semiconductor integrated circuit with a latch circuit.
Figure 4:
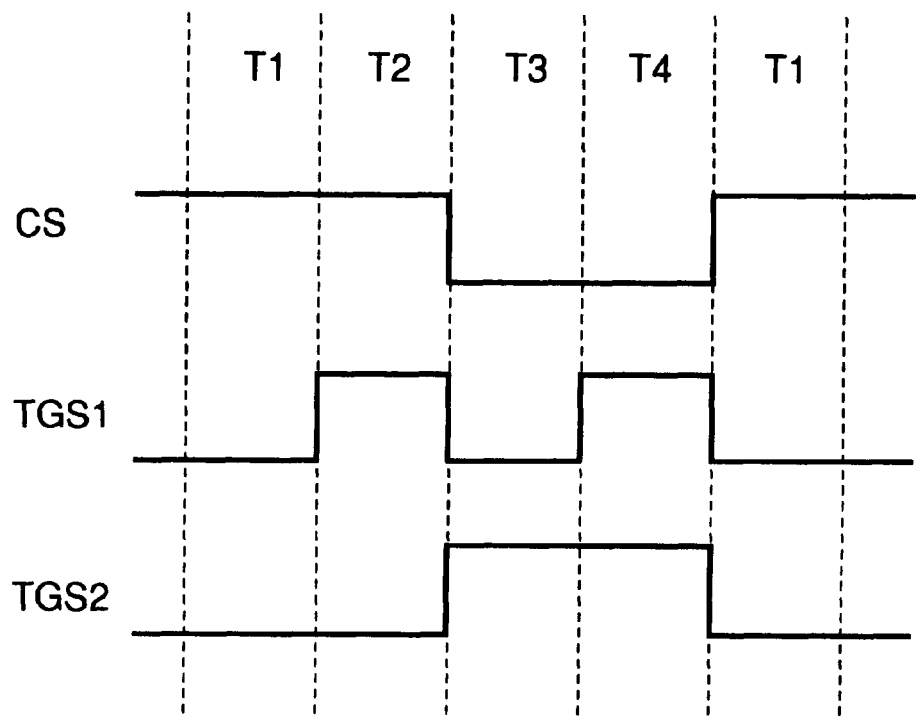
FIG. 4 is a timing chart for describing an operation of the circuit illustrated in FIG. 3.

Now, description will be made about preferred embodiments of this invention with reference to the drawing.

Figure 5:
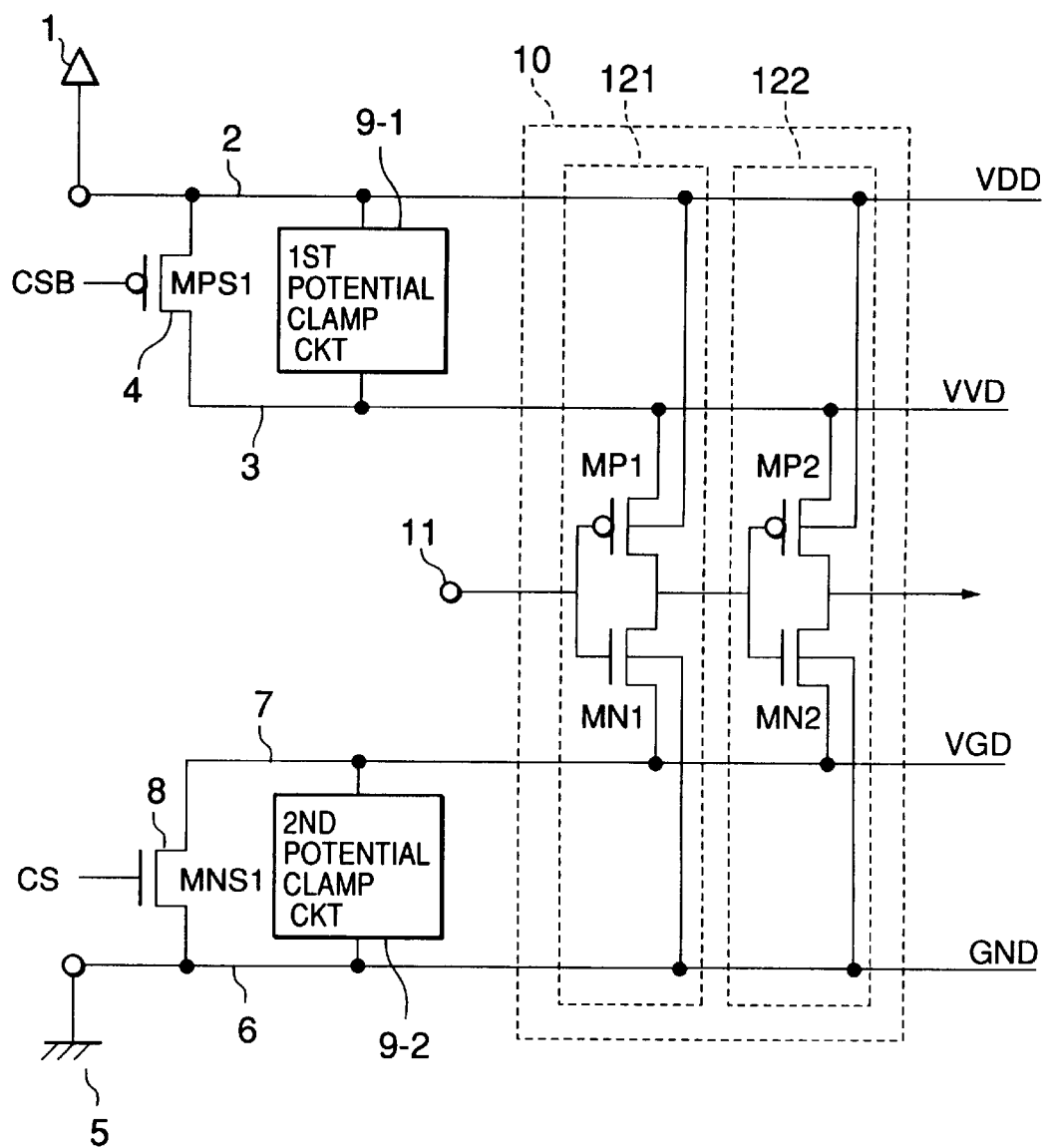
FIG. 5 shows a semiconductor integrated circuit according to a first embodiment of this invention.

Referring to FIG. 5, a semiconductor integrated circuit according to a first embodiment of this invention comprises a logical circuit 10, a first power supply switching circuit, and a second power supply switching circuit. The first power supply switching circuit comprises a first control transistor 4 and a first potential clamp circuit 9-1 and is arranged between a power supply line (VDD) 2 connected to a power supply 1 and a virtual power supply line (VVD) 3. Likewise, the second power supply switching circuit comprises a second control transistor 8 and a second potential clamp circuit 9-2 and is arranged between a grounding line (GND) 6 connected to the ground 5 and a virtual grounding line (VGD) 7. The logical circuit 10 has a first power supply terminal connected to the virtual power supply line (VVD) 3 and a second power supply terminal connected to the virtual grounding line (VGD) 7. The logical circuit 10 comprises P-channel and N-channel MOSFETs. All of substrate terminals of the P-channel MOSFETs are connected to the power supply line (VDD) 2 while all of substrate terminals of the N-channel MOSFETs are connected to the grounding line (GND) 6. The logical circuit 10 illustrated in FIG. 5 comprises first and second inverters 121 and 122 connected in cascade to an input terminal 11.

As a modification of the first embodiment, one of the first and the second power supply switching circuits may be omitted with the other acting as a single power supply switching circuit. In case where the first power supply switching circuit comprising the first control transistor 4 and the first potential clamp circuit 9-1 is used as the single power supply switching circuit, the second power supply terminal of the logical circuit 10 is directly connected to the grounding line (GND) 6 without passing through a combination of the virtual grounding line (VGD) 7 and the second power supply switching circuit comprising the second control transistor 8 and the second potential clamp circuit 9-2. On the other hand, in case where the second power supply switching circuit comprising the second control transistor 8 and the second potential clamp circuit 9-2 is used as the single power supply switching circuit, the first power supply terminal of the logical circuit 10 is directly connected to the power supply line (VDD) 2 without passing through a combination of the virtual power supply line (VVD) 3 and the first power supply switching circuit comprising the first control transistor 4 and the first potential clamp circuit 9-1.

Next, description will be made about an active mode and a sleep mode in the first embodiment. It is assumed here that a power supply voltage (VDD), a clamp potential of the virtual power supply line (VVD) 3, and a clamp potential of the virtual grounding line (VGD) are equal to 2.5 V, 1.9 V, and 0.6 V, respectively.

In the active mode (CS=high level, CSB=low level), the logical circuit 10 is electrically fed from the power supply 1 through the first and the second control transistors 4 and 8 in a conductive state. At this time, the first and the second potential clamp circuits 9-1 and 9-2 are not operated. The power supply line (VDD) 2 and the virtual power supply line (VVD) 3 are substantially equal in potential to each other. Likewise, the grounding line (GND) and the virtual grounding line (VGD) 7 are substantially equal in potential to each other.

When the active mode is switched into the sleep mode (CS=low level, CSB=high level), both of the first and the second control transistors 4 and 8 are turned off. An off current flows through each of the first and the second control transistors 4 and 8. Generally, the total gate width of the transistors forming the logical circuit 10 is considerably greater than the gate width of each of the first and the second control transistors 4 and 8. Therefore, the potential of the virtual power supply line (VVD) 3 is gradually lowered while the potential of the virtual grounding line (VGD) 7 is gradually raised. It is noted here that the potential of the virtual power supply line (VVD) 3 is not lowered below 1.9 V by the operation of the first potential clamp circuit 9-1. Likewise, the potential of the virtual grounding line (VGD) 7 is not raised above 0.6 V by the operation of the second potential clamp circuit 9-2.

It is assumed here that the circuit illustrated in FIG. 5 is in the sleep mode and that the potentials of the virtual power supply line (VVD) 3 and the virtual grounding line (VGD) 7 are clamped at 1.9 V and 0.6 V, respectively. In this event, a backgate bias voltage (Vbs) of 0.6 V is applied between a source terminal and a substrate terminal of each of two PMOSFET (MP1, MP2) and two NMOSFET (MN1, MN2) in the first and the second inverters 121 and 122 of the logical circuit 10. The backgate bias voltage will hereafter be referred to shortly as a back bias. When the back bias is applied to the MOSFET as described above, an absolute threshold voltage ($|Vt|$) is increased and the off current is decreased as compared with the case where no back bias is applied (Vbs=0 V).

Temporarily referring to FIG. 1, the back bias ($|Vbs|$) and the off current ($|Ioff|$) have a relationship illustrated in the figure where the gate length (L), the absolute threshold voltage ($|Vt|$), and the gate width (W) are equal to 0.25 μm, 0.2 V, and 50 μm, respectively. In case where the back bias ($|Vbs|$) of 0.6 V is applied as described above, the off current is reduced to about 1/10 and about 1/4 in the NMOSFET and in the PMOSFET, respectively, as compared with the case where no back bias is applied (Vbs=0 V).

As described above, according to this invention, each of the MISFETs forming the logical circuit is applied with the back bias in the sleep mode. Therefore, the threshold voltage (Vt) of the MISFET is increased so that current consumption in the sleep mode is saved.

In the structure illustrated in FIG. 5, each of the first and the second control transistors 4 and 8 need not be a high-threshold transistor and can be formed by a low-threshold transistor having an absolute threshold voltage on the order of 0.2 V (|Vt|=0.2 V), as is obvious from the foregoing description. Thus, it is possible to reduce the gate width of each of the first and the second control transistors 4 and 8 and to reduce the layout area as compared with the existing circuits using the high-threshold transistors.

In the structure illustrated in FIG. 5, it is possible to reduce the number of manufacturing steps by selecting the threshold voltage of each of the first and the second control transistors 4 and 8 to be equal to that of each of the PMOS and the NMOS in the logical circuit.

Figure 6:
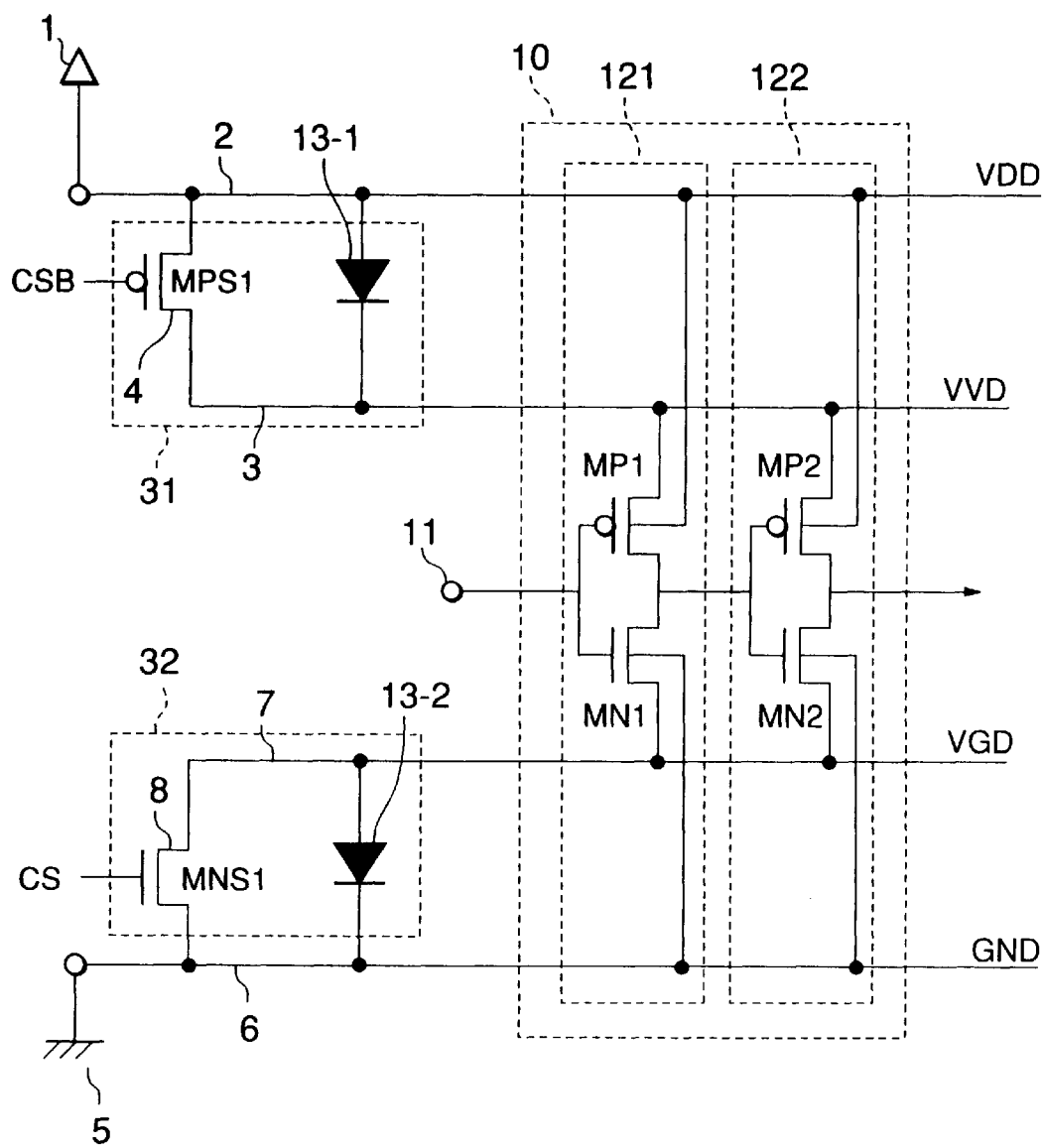
FIG. 6 shows a semiconductor integrated circuit according to a second embodiment of this invention.

Referring to FIG. 6, a semiconductor integrated circuit according to a second embodiment of this invention has a basic structure described in conjunction with FIG. 5 and is characterized in that each of the potential clamp circuits in FIG. 5 comprises a single diode. Specifically, the semiconductor integrated circuit according to the second embodiment comprises a first power supply switching circuit 31 including the first control transistor 4 and a first diode 13-1 and a second power supply switching circuit 32 including the second control transistor 8 and a second diode 13-2. The first diode 13-1 on a power supply side has an anode and a cathode connected to the power supply line (VDD) 2 and the virtual power supply line (VVD) 3, respectively. The second diode 13-2 on a ground side has an anode and a cathode connected to the virtual grounding line (VGD) 7 and the grounding line (GND) 6, respectively. Thus, it is possible to suppress each of potential differences between the power supply line (VDD) 2 and the virtual power supply line (VVD) 3 and between the grounding line (GND) 6 and the virtual grounding line (VGD) 7 to a level lower than a built-in voltage (Vfb) of each of the first and the second diodes 13-1 and 13-2.

Figure 7:
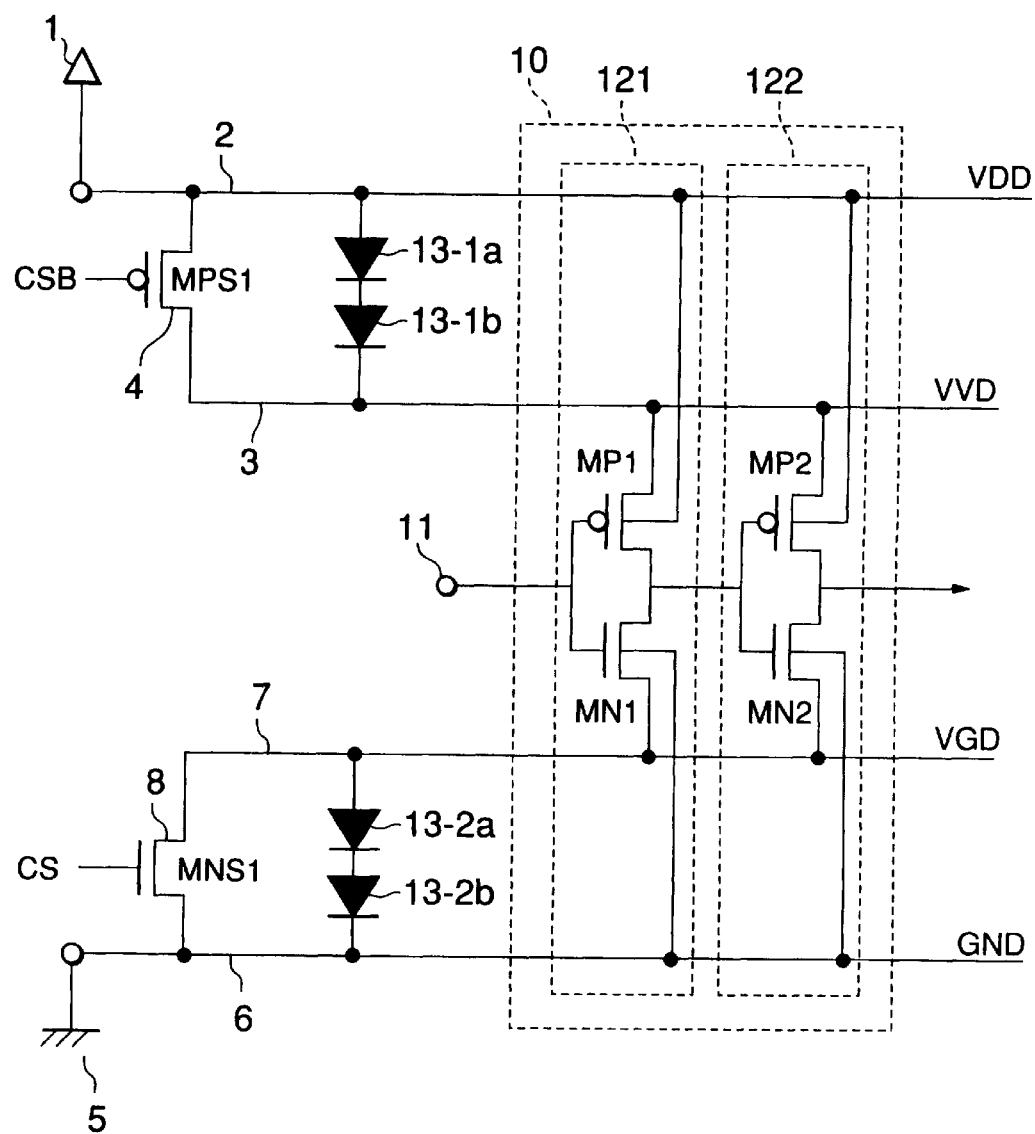
FIG. 7 shows a semiconductor integrated circuit according to a third embodiment of this invention.

Referring to FIG. 7, a semiconductor integrated circuit according to a third embodiment of this invention is similar to the second embodiment except that each of the potential clamp circuits comprises a pair of diodes connected in cascade. Specifically, the first potential clamp circuit comprises a first pair of diodes 13-1a and 13-1b while the second potential clamp circuit comprises a second pair of diodes 13-2a and 13-2b. In this embodiment also, it is possible to suppress each of the potential differences between the power supply line (VDD) 2 and the virtual power supply line (VVD) 3 and between the grounding line (GND) 6 and the virtual grounding line (VGD) 7 to a level lower than twice the built-in voltage (Vfb) of each of the diodes 13-1a, 13-1b, 13-2a, and 13-2b.

It is possible according to the second and the third embodiments to form the potential clamp circuits of a simple structure by the use of the built-in voltage of the diodes.

Figure 8:
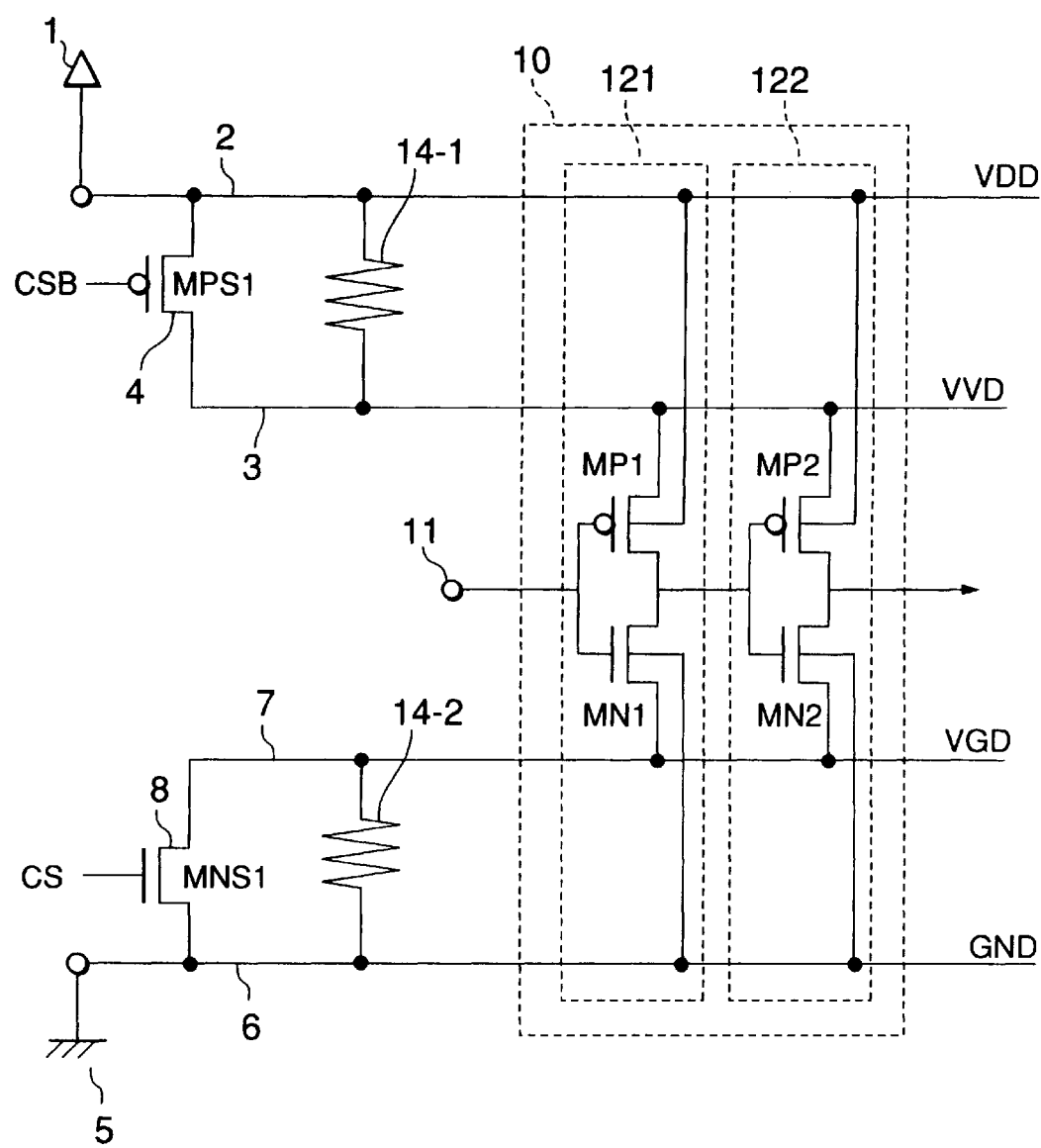
FIG. 8 shows a semiconductor integrated circuit according to a fourth embodiment of this invention.

Referring to FIG. 8, a semiconductor integrated circuit according to a fourth embodiment of this invention is similar to the second embodiment except that each of the potential clamp circuits comprises a single resistor. Specifically, the first potential clamp circuit comprises a first resistor 14-1 connected between the power supply line (VDD) 2 and the virtual power supply line (VVD) 3 while the second potential clamp circuit comprises a second resistor 14-2 connected between the grounding line (GND) 6 and the virtual grounding line (VGD) 7.

In the fourth embodiment, a potential difference is produced between the power supply line (VDD) 2 and the virtual power supply line (VVD) 3 by an electric current flowing through the first resistor 14-1 in the sleep mode. Likewise, a potential difference is produced between the grounding line (GND) 6 and the virtual grounding line (VGD) 7 by an electric current flowing through the second resistor 14-2 in the sleep mode. It is thus possible to apply the back bias to the MOSFETs forming the logical circuit 10.

In this embodiment, it is possible to form the potential clamp circuit of a simple structure by the use of the potential difference produced by the electric current flowing through each of the first and the second resistors 14-1 and 14-2 in the sleep mode.

Figure 9:
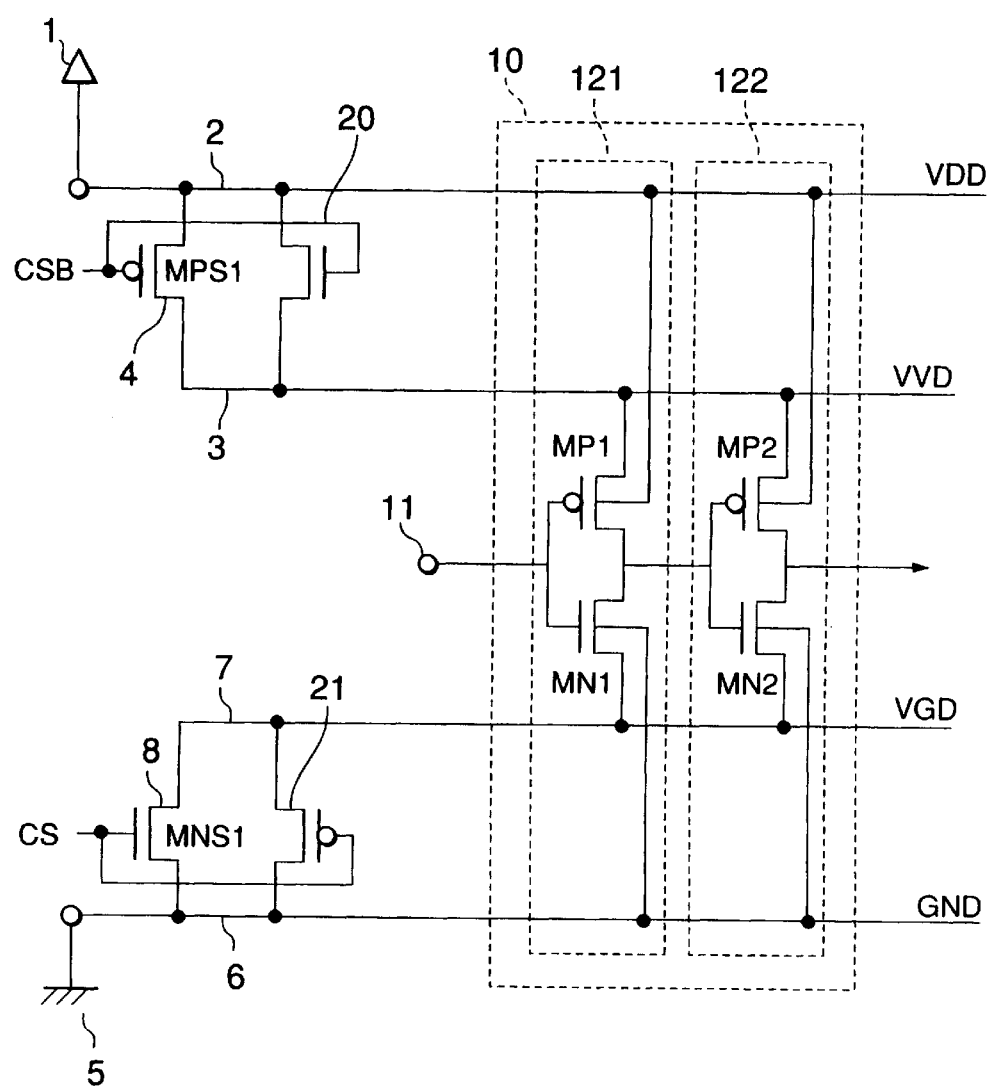
FIG. 9 shows a semiconductor integrated circuit according to a fifth embodiment of this invention.

Referring to FIG. 9, a semiconductor integrated circuit according to a fifth embodiment of this invention is similar to the second embodiment except that the first and the second potential clamp circuits comprise first and second potential clamp transistors 20 and 21 on a power supply side and a ground side, respectively. The first and the second potential clamp transistors 20 and 21 are reversed in channel type from the first and the second control transistors 4 and 8, respectively. The first and the second potential clamp transistors 20 and 21 have gate terminals supplied with signals identical with first and second control signals to the first and the second control transistors, respectively.

In this embodiment, it is possible to suppress, during the sleep period, the potential differences between the power supply line (VDD) 2 and the virtual power supply line (VVD) 3 and between the grounding line (GND) 6 and the virtual grounding line (VGD) 7 to levels lower than the absolute threshold voltages (|Vt|) of the first and the second power supply potential clamp transistor 20 and 21, respectively.

According to this embodiment, it is possible to form the potential clamp circuit of a simple structure by the use of the threshold voltage (Vt) of the potential clamp transistor.

Figure 10:
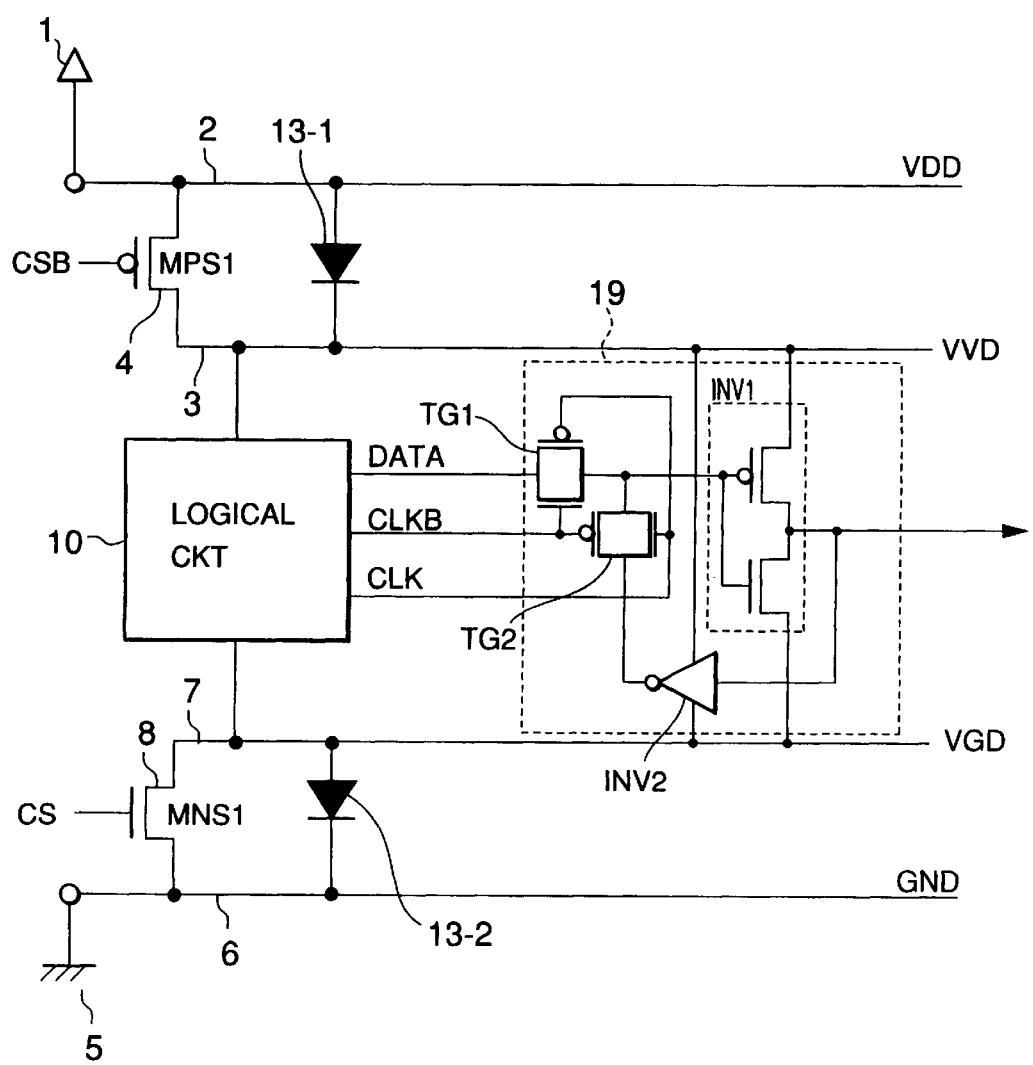
FIG. 10 shows a semiconductor integrated circuit according to a sixth embodiment of this invention.

Referring to FIG. 10, a semiconductor integrated circuit according to a sixth embodiment of this invention is similar to the second embodiment in FIG. 6 except that a latch circuit 19 is provided. In FIG. 10, connection between the logical circuit 10 and the first and the second power supply switching circuits is similar to that described in conjunction with FIG. 6. The latch circuit 19 serves to hold the data stored in an internal node (DATA) of the logical circuit 10. The latch circuit 19 is widely used in combination with a typical logical circuit and is not a special arrangement added to apply the structure of this invention. The latch circuit 19 illustrated in the figure comprises first and second inverters INV1 and INV2 and first and second transfer gates TG1 and TG2. Each of those transistors forming the latch circuit 19 in FIG. 10 has a threshold voltage (Vt) equal to that of each transistor in the logical circuit 10. Although not shown in FIG. 10, all substrate terminals of P-channel MOSFETs forming the latch circuit 19 are connected to the power supply line (VDD) 2 while all substrate terminals of N-channel MOSFETs are all connected to the grounding line (GND) 6.

It is assumed here that the power supply voltage (VDD) and the built-in voltage (Vfb) of each of the first and the second diodes 13-1 and 13-2 are equal to 2.5V and 0.7V, respectively. In this event, in the circuit illustrated in FIG. 10, the electric potentials of the virtual power supply line (VVD) 3 and the virtual grounding line (VGD) 7 are kept at 1.8 V or more and 0.7 V or less, respectively, even in the sleep period. Therefore, the internal node of each of the logical circuit 10 and the latch circuit 19 is kept at the state immediately before the active period is switched into the sleep period by turning the electric potentials of the virtual power supply line (VVD) 3 and the virtual grounding line (VGD) 7 into a high level and a low level, respectively.

Thus, with the structure of the power supply circuit of this invention, it is possible to hold the state of the high level and the low level at each node without providing a special latch circuit.

Figure 11:
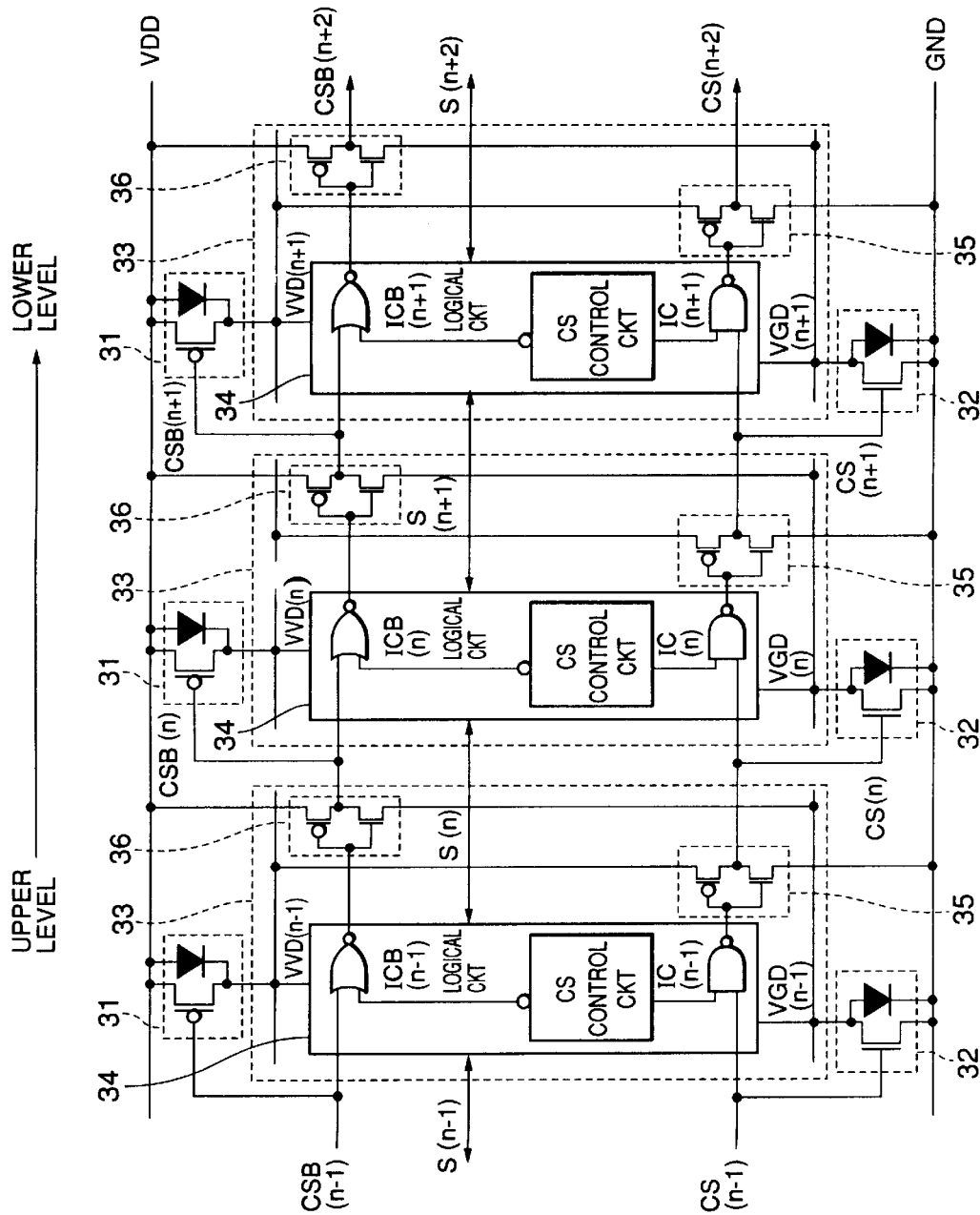
FIG. 11 shows a semiconductor integrated circuit according to a seventh embodiment of this invention.

Referring to FIG. 11, a semiconductor integrated circuit according to a seventh embodiment of this invention has a hierarchical structure comprising a plurality of circuits each of which is illustrated in FIG. 6.

As described in conjunction with FIG. 6, each of those circuits is provided with at least one of the first power supply switching circuit 31 comprising the first power supply switching transistor 4 connected between the power supply line (VDD) and the virtual power supply line (VVD) and the second power supply switching circuit 32 comprising the second power supply switching transistor 8 connected between the grounding line (GND) and the virtual grounding line (VGD). The active mode and the sleep mode are switched by turning on and off the power supply switching transistors. The seventh embodiment is directed to hierarchical control for the power supply switching transistors.

Referring to FIG. 11, an n-th level circuit group 33(n) is interposed between an (n−1)-th level circuit group 33(n−1) of an upper level and an (n+1)-th level circuit group 33(n+1) of a lower level which are illustrated left and right in the figure, respectively.

In the n-th level circuit group 33(n), the first power supply switching circuit 31 on the power supply side is connected between the power supply line (VDD) and the virtual power supply line (VVD(n)) while the second power supply switching circuit 32 on the ground side is connected between the grounding line (GND) and the virtual grounding line VGD(n). In order to produce active/sleep mode switching control signals CS(n+1) and CSB(n+1) supplied from the n-th level circuit group 33(n) to the (n+1)-th level circuit group 33(n+1), a CS inverter 35 and a CSB inverter 36 are provided at a final stage succeeding a logical circuit 34. The CS inverter 35 comprises an NMOS transistor and a PMOS transistor having a gate and a drain connected to a gate and a drain of the NMOS transistor, respectively. A source of the NMOS transistor is connected to the grounding line (GND) while a source of the PMOS transistor is connected to the virtual power supply line VVD(n). With the above-mentioned structure, the switching control signal CS(n+1) is given a ground (GND) level when the n-th level circuit group 33(n) is put into the sleep mode. Therefore, the second power supply switching circuit 32 connected to the (n+1)-th level circuit group 33(n+1) is turned off. Likewise, the CSB inverter 36 comprises an NMOS transistor and a PMOS transistor having a gate and a drain connected to a gate and a drain of the NMOS transistor, respectively. A source of the NMOS transistor is connected to the virtual grounding line VGD(n) while a source of the PMOS transistor is connected to the power supply line VDD. With the above-mentioned structure, the switching control signal CSB(n+1) is given a power supply (VDD) level when the n-th level circuit group 33(n) is put into the sleep mode. Therefore, the first power supply switching circuit 31 connected to the (n+1)-th level circuit group 33(n+1) is turned off.

In the circuit illustrated in FIG. 11, when the circuit group 33 of a particular level is put into the sleep mode, the circuit group 33 of a lower level is automatically put into the sleep mode. The switching control signals CS and CSB in the sleep mode have the ground (GND) potential and the power supply (VDD) potential, respectively. In this manner, sophisticated power management is enabled for each circuit group 33 so as to achieve low-power operation.

Hereinafter, the seventh embodiment will be described more in detail.

In this embodiment, the circuit groups 33 have power supply systems independent from one another and are arranged in a hierarchical structure such that the power supply switching circuits 32 and 31 of a particular circuit group 33 of a particular level are controlled by the switching control signals CS and CSB supplied from another circuit group 33 of an upper level. In this embodiment, signal transmission and reception is carried out only between the particular circuit group 33 and another circuit group of a different level upper or lower by one level than the particular level.

In FIG. 11, the first power supply switching circuit 31 comprises a low-threshold PMOS transistor and a diode applied with a forward bias. On the other hand, the second power supply switching circuit 32 comprises a low-threshold NMOS transistor and a diode applied with a forward bias. When the PMOS and the NMOS transistors are turned off to switch the active mode into the sleep mode, the diodes serve to clamp the virtual power supply line VVD and the virtual grounding line VGD so that the electric potential of the virtual power supply line VVD is not lowered to a level lower by more than a particular voltage below the power supply potential VDD and that the electric potential of the virtual grounding line VGD is not raised to a level higher by more than a particular voltage above the ground potential GND. By the above-mentioned operation of the diodes, the state of the electric potential (high level, low level) at each node in the circuit is held even in the sleep mode. The potential clamp circuits in the first and the second power supply switching circuits 31 and 32 are not restricted to the diodes illustrated in FIG. 11 but may comprise various other devices illustrated in FIGS. 7 through 9.

In FIG. 11, the (n−1)-th level circuit group 33(n−1) and the (n+1)-th level circuit group 33(n+1) of the upper and the lower levels are arranged on both sides of the n-th level circuit group 33(n). The power supply systems of these circuit groups 33 are independent from one another. Each circuit group 33 is provided with the first and the second power supply switching circuits 31 and 32 on the power supply side and the ground side, respectively. The circuit group 33 at each level comprises the logical circuit 34, the CS inverter 35, and the CSB inverter 36. The logical circuit 34 at each level is connected to the virtual power supply line VVD and the virtual grounding line VGD. Although not shown in the figure, substrate potentials of the PMOS and the NMOS transistors forming each circuit group 33 in FIG. 11 are fed from the power supply line VDD and the grounding line GND, respectively. In this embodiment, the logical circuit 34 at each level comprises an ordinary CMOS logical circuit (for example, 10 in FIG. 5), a CS control circuit, a NAND gate, and a NOR gate. The NAND gate is supplied with one output signal of the CS control circuit and the switching control signal CS from the upper-level circuit group. The NOR gate is supplied with the other output signal of the CS control circuit and the switching control signal CSB from the upper-level circuit group. As illustrated in FIG. 11, the logical circuit 34 transmits and receives a signal S to and from another circuit group of a different level upper or lower by one level. The circuit structures of the CS inverter 35 and the CSB inverter 36 have already been described and will not be described any longer.

In this embodiment, the logical circuit 34 includes the CS control circuit so that the control signals for the power supply switching circuits of a lower level can be produced at each level. Among the output signals of the CS control circuit, a positive-logic signal IC ("high" and "low" corresponding to "on" and "off" of the power supply switching circuit of a lower level, respectively) is supplied to the two-input NAND gate together with the switching control signal CS from an upper-level circuit group. The NAND gate produces a NAND output signal supplied to an input of the CS inverter 35. On the other hand, among the output signals of the CS control circuit, a negative-logic ("high" and "low" corresponding to "off" and "on" of the power supply switching circuit of a lower level, respectively) signal ICB is supplied to the two-input NOR gate together with the switching control signal CSB from the upper-level circit group. The NOR gate produces a NOR output signal supplied to an input of the CSB inverter 36.

Figure 12:
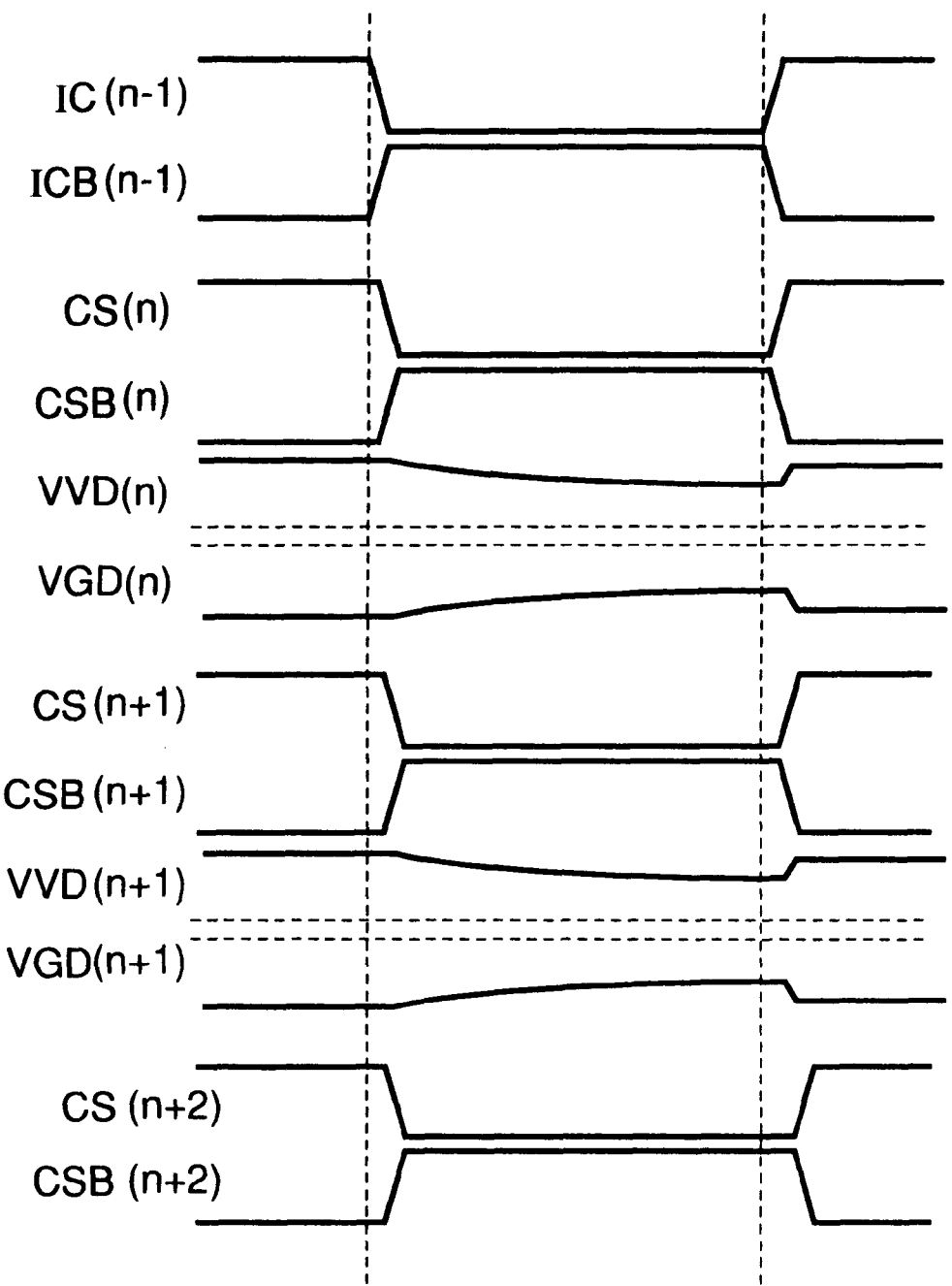
FIG. 12 is a time chart for describing an operation of the semiconductor integrated circuit illustrated in FIG. 11.

Referring to FIG. 12 in addition to FIG. 11, the operation of the seventh embodiment will be described. At first, description will be directed to the case where all of the (n−1)-th, the n-th, and the (n+1)-th level circuit groups 33 are in the active mode and the logical circuit 34 in the (n−1)-th level circuit group produces the signal for turning the lower-level circuit group into the sleep mode. In an initial state, all of the (n−1)-th, the n-th, and the (n+1)-th level circuit groups 33 are in the active mode so that all of the switching control signals CS(n−1), CS(n), CS(n+1), and CS(n+2) have a high level while all of the switching control signals CSB(n−1), CSB(n), CSB(n+1), and CSB(n+2) have a low level. The CS control circuit in the circuit group of each level produces the signal for putting the circuit group of a lower level into the active mode. Therefore, the first and the second power supply switching circuits 31 and 32 on the power supply side and the ground side are turned on in each level. The virtual power supply lines VVD(n−1), VVD(n), and VVD(n+1) of the respective circuit groups 33 are given the power supply potential VDD. The virtual grounding lines VGD(n−1), VGD(n), and VGD(n+1) of the respective circuit groups 33 are given the ground potential GND. In this state, it is assumed that the CS control circuit of the logical circuit 34 in the (n−1)-th level circuit group 33 produces the signal for putting the lower level circuit group into the sleep mode. In this event, the signals IC(n−1) and ICB(n−1) have a low level and a high level, respectively. The two-input NAND gate supplied with the signal IC(n−1) produces a high level and the CS inverter produces a low level. Therefore, the second power supply switching circuit 32 on the ground side at the n-th level is turned off. On the other hand, the two-input NOR gate supplied with the signal ICB(n−1) produces a low level and the CSB inverter produces a high level. Therefore, the first power supply switching circuit 31 on the power supply side at the n-th level is turned off in the similar manner. Thus, the switching control signals CS and CSB produced in the (n−1)-th level circuit group 33 put the n-th level circuit group 33 into the sleep mode.

When the n-th level circuit group 33 is in the sleep mode, the electric potential of the virtual power supply line VVD (n) is lowered below the power supply potential (VDD) and the electric potential of the virtual grounding line VGD(n) is raised above the ground potential (GND). The variations in potential of the virtual power supply line VVD(n) and the virtual grounding line VGD(n) in the sleep mode are clamped by the diodes in the first and the second power supply switching circuits 31 and 32, respectively, so that a certain potential difference is left between the virtual power supply line VVD and the virtual grounding line VGD. By the potential difference, the potential relationship (high and low) between the internal nodes of the n-th level circuit group 33 is held even in the sleep mode. This operation is similar to that described in the foregoing. In this state, the switching control signals CS(n) and CSB(n) have a low level and a high level, respectively. Therefore, the CS inverter 35 and the CSB inverter 36 in the n-th level circuit group are supplied with the high level and the low level to produce the switching control signals CS(n+1) and CSB(n+1) of the low level and the high level, respectively. In the circuit structure of this embodiment, the source of the NMOS transistor of the CS inverter 35 is connected to the grounding line GND while the source of the PMOS transistor of the CSB inverter 36 is connected to the power supply line VDD. Therefore, even if the n-th level circuit group 33 is in the sleep mode, the power supply switching control signals CS and CSB of the (n+1)-th level are given the ground and the power supply potentials (VDD and GND), respectively, and are not given intermediate potentials of the virtual power supply line VDD(n) and the virtual grounding line VGD(n). Thus, it is possible to decrease a leakage current at each of the power supply switching circuits 31 and 32 of the (n+1)-th level in the sleep mode. As a result, the (n+1)-th level circuit group 33 is also put into the sleep mode. In the (n+1)-th circuit group, the power supply switching control signals CS(n+2) and CSB(n+2) are produced as the ground potential GND (low) and the power supply potential VDD (high), respectively, in the manner similar to that described in conjunction with the n-th level circuit group. Thus, although not illustrated in the figure, the (n+2)-th level circuit group 33 is also put into the sleep mode.

In the above-mentioned state, it is assumed that the CS control circuit of the logical circuit 34 in the (n−1)-th level circuit group 33 produces the signal for putting the lower-level circuit group into the active mode. In this event, as illustrated in FIG. 12, the signals IC(n−1) and ICB(n−1) are given a high level and a low level, respectively. The two-input NAND gate supplied with the signal IC(n−1) produces a low level and the CS inverter 35 produces a high level. Therefore, the second power supply switching circuit 32 on the ground side at the n-th level is turned on. On the other hand, the two-input NOR gate supplied with the signal ICB(n−1) produces a high level and the CSB inverter 36 produces a low level. Therefore, the first power supply switching circuit 31 on the power supply side at the n-th level is turned on in the similar manner. As a result, the virtual power supply line VVD(n) and the virtual grounding line VGD(n) of the n-th level circuit group 33 have the power supply potential VDD and the ground potential GND. Therefore, the n-th level circuit group 33 is put into the active mode again.

When the n-th level circuit group 33 is put into the active mode, the two-input NAND gate supplied with the signal CS(n) produces the low level and the CS inverter 35 produces the signal CS(n+1) of the high level. Therefore, the second power supply switching circuit 32 on the ground side at the (n+1)-th level is turned on. On the other hand, the two-input NOR gate supplied with the signal CSB(n) produces the high level and the CSB inverter 36 produces the signal CSB(n+1) of the low level. Therefore, the first power supply switching circuit 31 on the power supply side at the (n+1)-th level is turned on in the similar manner. By the above-mentioned variation in signals, the (n+1)-th level circuit group 33 is also put into the active mode.

In the (n+1)-th level circuit group 33, signal processing similar to that described in conjunction with the n-th level circuit group 33 is carried out. As a result, the CS inverter 35 produces the switching control signal CS(n+2) of the high level while the CSB inverter 36 produces the switching control signal CSB(n+2) of the low level. Therefore, although not shown in the figure, the (n+2)-th level circuit group 33 is also put into the active mode.

As described above, when the circuit group of a particular level is put into the sleep mode, those circuit groups of lower levels are automatically put into the sleep mode in this embodiment. On the contrary, those circuit groups of the particular and the lower levels can be collectively recovered into the active mode.

As described above, the hierarchical control of the power supply switching circuits can be realized according to this invention. This enables individual power management for each circuit group 33. Therefore, power consumption can be saved not only in the sleep mode but also in the active mode. In this invention, even if the particular circuit group of a particular level is put into the sleep mode, each of the power supply switching control signals for the lower level produced by the particular circuit group does not have the intermediate potential but has the power supply potential or the ground potential. Therefore, it is possible to decrease the leakage current at each of the power supply switching circuits of the lower level.

Figure 13:
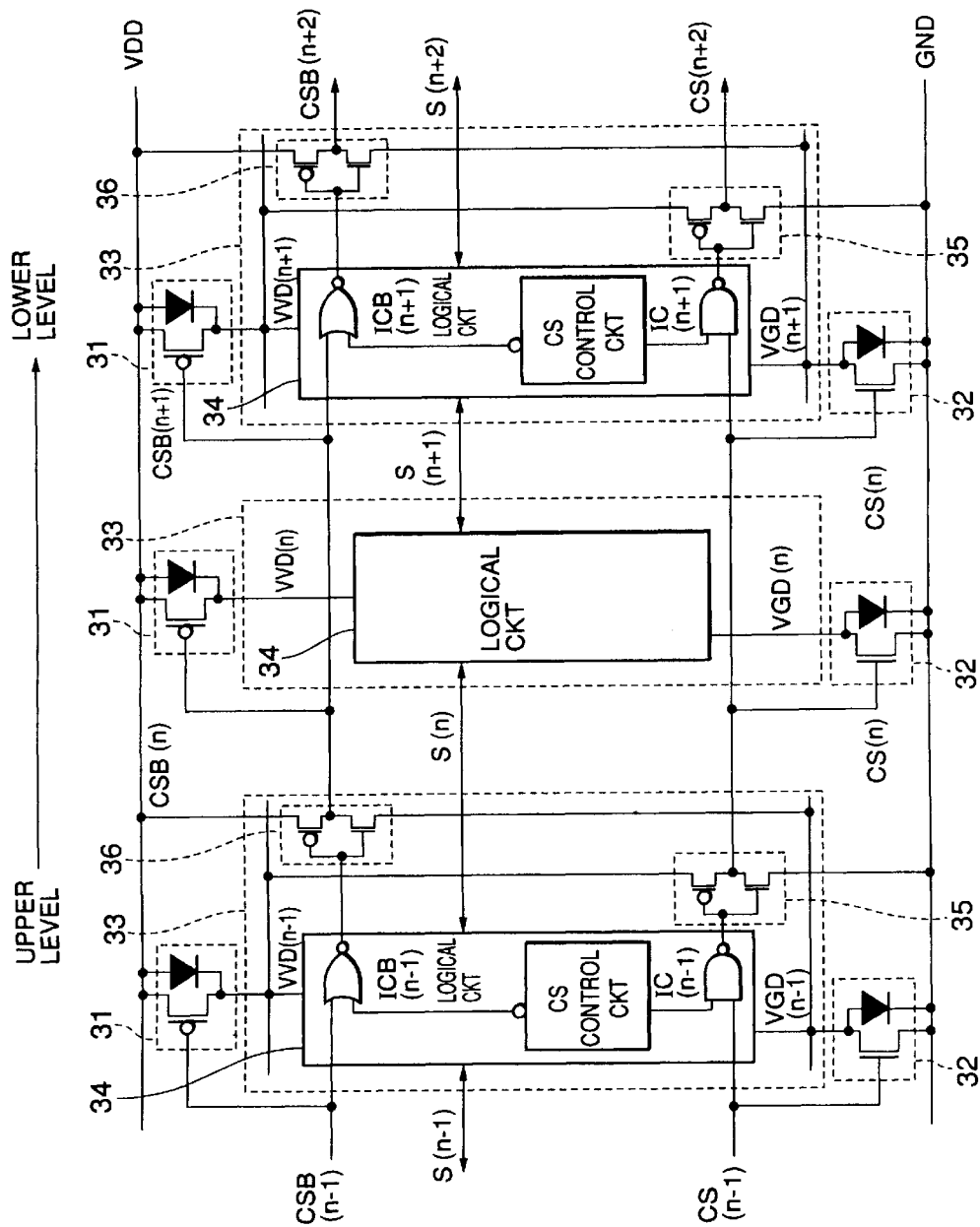
FIG. 13 shows a semiconductor integrated circuit according to an eighth embodiment of this invention.

Referring to FIG. 13, a semiconductor integrated circuit according to an eighth embodiment of this invention is similar to the seventh embodiment in FIG. 11 except that the n-th level circuit group 33 does not have the CS control circuit. In FIG. 13, the n-th level circuit group 33 is interposed between the (n−1)-th and the (n+1)-th level circuit groups 33 of the upper level and the lower level which are illustrated left and right in the figure, respectively, like in FIG. 11. The power supply systems of the circuit groups are independent from one another. Each circuit group 33 has the first and the second power supply switching circuits 31 and 32 on the power supply side and the ground side, respectively. In this embodiment, the logical circuit 34 in the n-th level circuit group 33 does not include the CS control circuit. With this structure, the switching control signals CS(n) and CSB(n) produced by the (n−1)-th level circuit group 33 serve to control the power supply switching circuits of both of the two circuit groups 33 of the n-th level and the (n+1)-th level.

With this structure, it is possible to simplify the n-th level circuit group and to reduce the number of devices.

Figure 14:
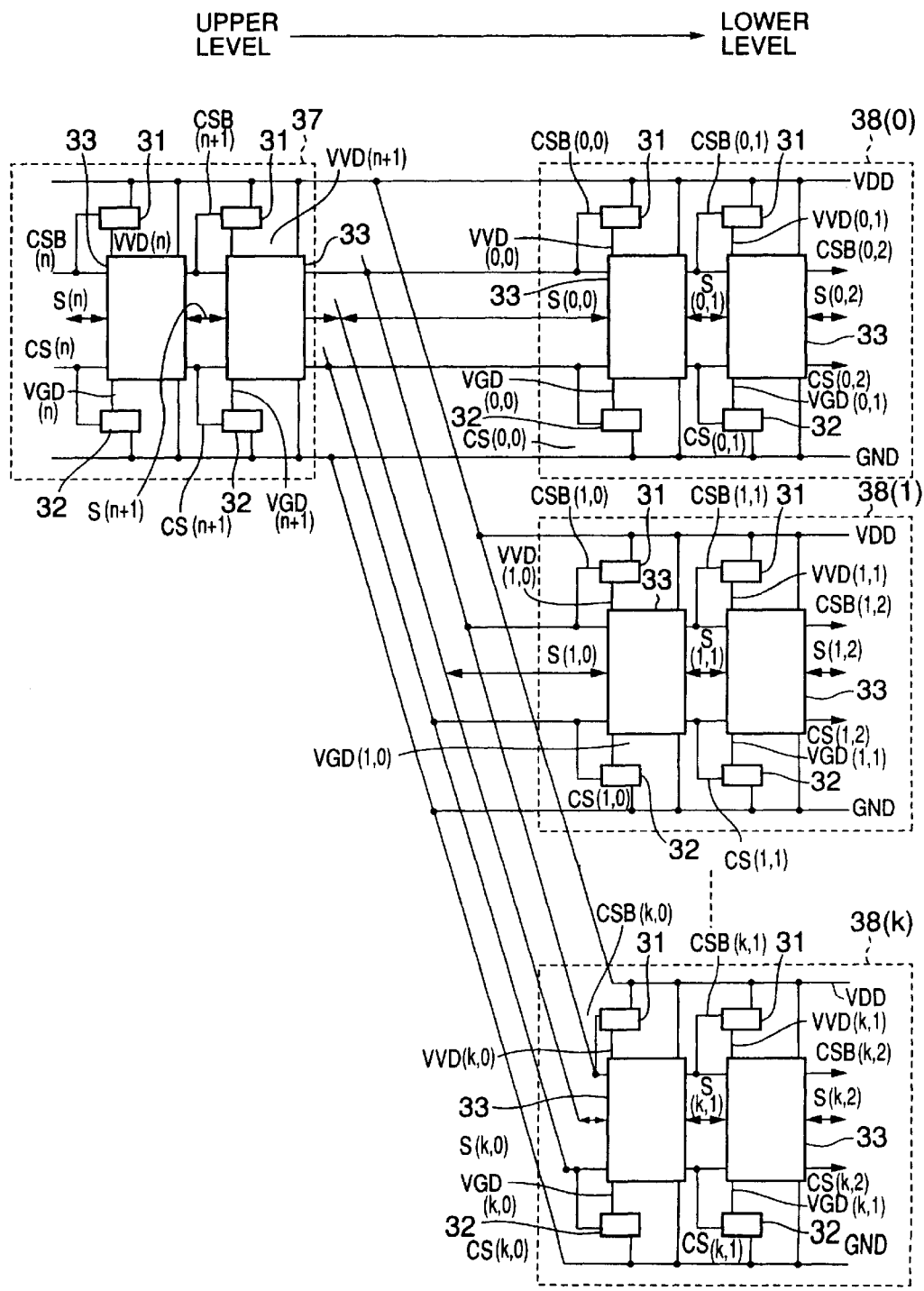
FIG. 14 shows a semiconductor integrated circuit according to a ninth embodiment of this invention.

Referring to FIG. 14, a semiconductor integrated circuit according to a ninth embodiment has a branched hierarchical structure in controlling the power supply switching circuits in contrast with the seventh and the eighth embodiment in FIGS. 11 and 13 each of which show the hierarchical structure without any branch.

As illustrated in FIG. 14, an n-series circuit set 37 including the n-th level and the (n+1)-th level circuit groups produces power-supply-side control signals which are branched to zeroth through k-th circuit groups 38(0) through 38(k), (k+1) in number, in a k-series circuit set. In this structure, it is possible for the (n+1)-th level circuit group 33 in the n-series circuit set 37 to selectively set the active mode or the sleep mode for each of the (k+1) circuit groups in the k-series circuit set. Actually, the above-mentioned structure for power supply control is effective for a circuit through a decoding circuit. For example, a word line decoder of a RAM (random access memory) or a ROM (read-only memory) often has a structure such that a single word line is selected from a plurality of word lines, 2m in number (m being an integer not smaller than 1). Therefore, when the single word line is selected and the high level is produced from the word line, a word line driver for each of the remaining word lines can be put into the sleep mode in which the ground level is produced with the structure similar to that of the CS inverter 35 illustrated in FIG. 11. Thus, the word line drivers, (2m−1) in number, can be put into the sleep mode even during operation of the RAM or the ROM. It is therefore possible to decrease an operation power of the RAM or the ROM circuit.

Figure 15:
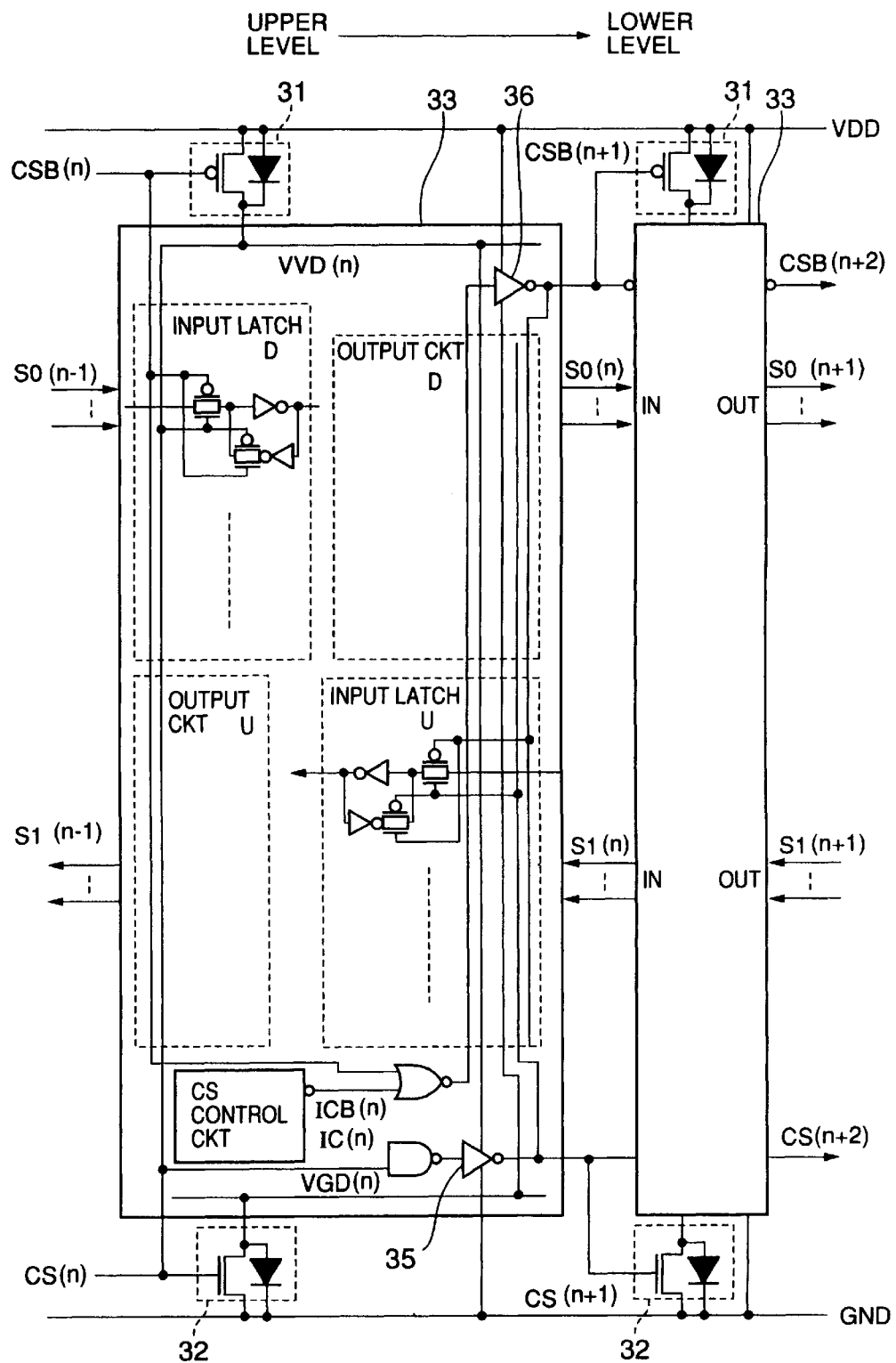
FIG. 15 shows a semiconductor integrated circuit according to a tenth embodiment of this invention.

Referring to FIG. 15, a semiconductor integrated circuit according to a tenth embodiment will be described. In the seventh, the ninth, and the tenth embodiments of FIGS. 11, 13, and 14, no special reference is made to those signals between different levels. When the circuit group of the lower level is put into the sleep mode, the output signal produced by the lower-level circuit group has a signal level equal to the electric potential of the virtual power supply line or the virtual grounding line. Since these signal levels are intermediate potentials, the leakage current is increased in the circuit group of the upper level if these output signals are supplied to the upper-level circuit group in the active mode. The tenth embodiment has a circuit structure to solve the above-mentioned problem.

Referring to FIG. 15, consideration will be made about signal transmission and reception between the n-th level and the (n+1)-th level circuit groups. In this embodiment, the n-th level circuit group 33 comprises an input latch D responsive to the power supply switch control signals CS(n) and CSB(n) from the upper level to be turned into a latch state and a data-through state, and an input latch U responsive to the power supply switch control signals CS(n+1) and CSB(n+1) generated at the n-th level to be turned into a latch state and a data-through state. Each of the input latches D and U has a circuit structure such that the signals are received by transfer gates. The input latch D is supplied with an output signal S0(n−1) from the upper level while the input latch U is supplied with an output signal S1(n) from the lower level.

It is assumed here that the signal for putting the (n+1)-th level circuit group into the sleep mode is produced in the n-th level. In this event, the power supply switch control signals CS(n+1) and CSB(n+1) have the ground potential and the power supply potential, respectively. Thus, the (n+1)-th level circuit group 33 is put into the sleep mode and the input latch U is turned from the data-through state into the latch state. In the input latch U, the transfer gates are turned off by the power supply switch control signals CS(n+1) and CSB(n+1). Therefore, even if the signal SI(n) of the intermediate potential is supplied from the (n+1)-th level circuit group in the sleep mode, no leakage current is produced in the n-th level circuit group.

As described above, it is possible according to this embodiment to avoid the increase in leakage current occurring in the input circuit of the upper-level circuit group when the lower-level circuit group is put into the sleep mode. The structure of this embodiment is applicable to the ninth and the tenth embodiments in FIGS. 13 and 14 to provide the similar effect.

Figure 16:
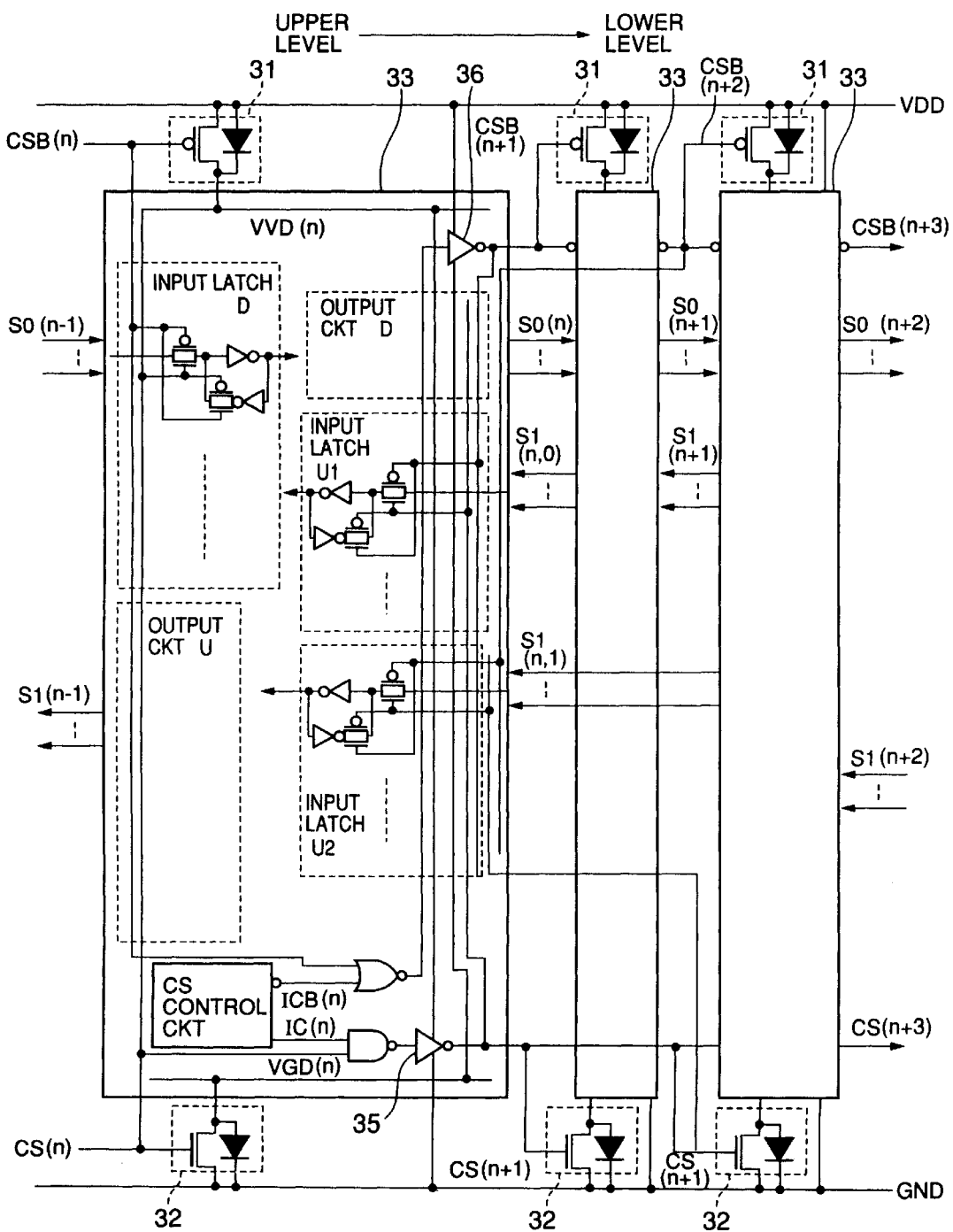
FIG. 16 shows a semiconductor integrated circuit according to an eleventh embodiment of this invention.

Referring to FIG. 16, a semiconductor integrated circuit according to an eleventh embodiment of this invention enables transmission and reception of signals between an upper level and a lower level with an intermediate level skipped in contrast to the embodiments in FIGS. 11, 13, 14, and 15 in which signal transmission and reception is carried out between a particular level and an adjacent level upper or lower by one level than the particular level.

Referring to FIG. 16, consideration will be made about transmission and reception of signals among the n-th level, the (n+1)-th level, and the (n+2)-th level. In addition to the signal transmission and reception between the n-th and the (n+1)-th levels and between the (n+1)-th and the (n+2)-th levels, the signal SI(n,1) as a part of the output from the (n+2)-th level is supplied to the n-th level. The n-th level circuit group 33 comprises the input latch D supplied with the power supply switch control signals CS(n) and CSB(n) from the upper level to be turned into the latch state and the data-through state, an input latch U1 responsive to the power supply switch control signals CS(n+1) and CSB(n+1) generated at the n-th level to be turned into the latch state and the data-through state, and an input latch U2 responsive to the power supply switch control signals CS(n+2) and CSB(n+2) generated at the (n+1)-th level to be turned into the latch state and the data-through state. Each of the input latches D, U1, and U2 has a circuit structure such that the signal is received by the transfer gates. The input latch D is supplied with the output signal SO(n−1) from the upper level. The input latch U1 is supplied with the output signal SI(n,0) from the (n+1)-th level. The input latch U2 is supplied with the output signal SI(n,1) from the (n+2)-th level.

It is assumed here that the signal for putting the (n+1)-th level circuit group into the sleep mode is produced in the n-th level. In this event, the power supply switch control signals CS(n+1) and CSB(n+1) have the ground potential and the power supply potential, respectively. Thus, the (n+1)-th level circuit group 33 is put into the sleep mode and the input latch U1 is turned from the data-through state into the latch state. Furthermore, the (n+2)-th level circuit group 33 is put into the sleep mode and the input latch U2 is turned from the data-through state into the latch state. In the input latch U1, the transfer gates are turned off by the power supply switch control signals CS(n+1) and CSB(n+1). Therefore, even if the signal SI(n,0) of the intermediate potential is supplied from the (n+1)-th level circuit group in the sleep mode, no leakage current is produced in the nth level circuit group. Likewise, in the input latch U2, the transfer gates are turned off by the power supply switch control signals CS(n+2) and CSB(n+2). Therefore, even if the signal SI(n,1) of the intermediate potential is supplied from the (n+2)-th level circuit group in the sleep mode, no leakage current is produced in the n-th level circuit group.

Thus, even if signal transmission is carried out not only between a particular level and a next adjacent level upper or lower by one level, it is possible according to this embodiment to inhibit increase in leakage current caused in the input circuit of the upper-level circuit group when the lower-level circuit group is put into the sleep mode. The structure of this invention is applicable to the embodiment of FIGS. 13 and 14 to provide the similar effect.

As described above, according to this invention, the control transistor and the potential clamp circuit are arranged between the power supply line and the virtual power supply line. With this structure, even if the control transistor is rendered nonconductive and the logical circuit with its power supply terminal connected to the virtual power supply line is put into a sleep mode, the virtual power supply line is clamped at a certain potential. Therefore, the MISFETs forming the logical circuit are applied with the back bias so that the threshold voltage becomes higher than that in the active mode. It is thus possible to reduce the leakage current. With this circuit structure, the absolute threshold voltage |Vt| of the control transistor can be selected as low as those of the MISFETs forming the logical circuit. Therefore, the gate width and the layout area of the control transistor can be reduced. By selecting the absolute threshold voltage |Vt| of the control transistor to be equal to those of the MISFETs forming the logical circuit upon manufacture, the number of manufacturing steps can be reduced and the production cost can be suppressed as compared with the previous technique.

In the semiconductor integrated circuit of this invention, it is possible to keep, in the sleep mode, the potential relationship (high level, low level) of the internal nodes immediately before switching from the active mode into the sleep mode. Therefore, the special latch circuit for holding the data in the sleep mode need not be added. Furthermore, the timing design of the control signal is no longer necessary. Thus, it is possible to reduce the layout area and to facilitate the design work.

It is also possible according to this invention to realize sophisticated power management by means of hierarchical power supply control.

What is claimed is:

1. A semiconductor integrated circuit of a given-level circuit of a given level in a hierarchical structure:
   a logical circuit including a complement transistor formed by a combination of P-channel and N-channel MIS field-effect transistors, and first and second power supply terminals connected to said P-channel and said N-channel MIS field-effect transistors, respectively;
   a power supply line connected to a power supply;
   a grounding line connected to the ground;
      wherein said P-channel MIS field-effect transistor has a substrate terminal connected to said power supply line and said N-channel MIS field-effect transistor has a substrate terminal connected to said grounding line,
   a power feeding section connected to said power supply line and said logical circuit, said power feeding section comprising:
      a virtual power supply line connected to said first power supply terminal of said logical circuit;
      a first power supply switching circuit connected between said power supply line and said virtual power supply line, said first power supply switching circuit comprising:
         a first control transistor of a P-channel MIS type field effect transistor connected between said power supply line and said virtual power supply line; and
         a first clamp circuit connected between said power supply line and said virtual power supply line to clamp, when said first control transistor is turned off, an electric potential of said virtual power supply line at a first clamp potential which is lower than an electric potential of said power supply line and higher than an electric potential of said grounding line;
      a virtual grounding line connected to said second power supply terminal of said logical circuit; and
      a second power supply switching circuit connected between said grounding line and said virtual grounding line, said second power supply switching circuit comprising:
         a second control transistor of an N-channel MIS type connected between said grounding line and said virtual grounding line; and
         a second clamp circuit connected between said grounding line and said virtual grounding line to clamp, when said second control transistor is turned off, an electric potential of said virtual grounding line at a second clamp potential which is higher than an electric potential of said grounding line and lower than said first clamp potential;

wherein said first and said second clamp circuits, when said first and said second control transistors are turned off, make said logical circuit continuously hold the state of a logic level which an internal node of said logical circuit has immediately before said first and said second control transistors are turned off;

an upper-level circuit of an upper level;
  wherein said first control transistor of said given-level circuit is responsive to a first switching signal from said upper-level circuit to be turned off when said first switching signal has a high level; and
  wherein said second control transistor of said given-level circuit is responsive to a second switching signal from said upper-level circuit to be turned off when said second switching signal has a low level;

a lower-level circuit of a lower level, said given-level circuit comprising:
  switching signal producing means for producing said first and said second switching signals;
  a NOR circuit connected to said upper-level circuit and said switching signal producing means for calculating a NOR'ed result of said first switching signal supplied from said upper-level circuit and said first switching signal supplied from said switching signal producing means;
  a first inverter for inverting an output signal of said NOR circuit;
  a NAND circuit connected to said upper-level circuit and said switching signal producing means for calculating a NAND'ed result of said second switching signal supplied from said upper-level circuit and said second switching signal supplied from said switching signal producing means; and
  a second inverter for inverting an output signal of said NAND circuit,
  wherein said first inverter produces an output signal which is supplied to said lower-level circuit as said first switching signal for said lower-level circuit, and
  wherein said second inverter produces an output signal which supplied to said lower-level circuit as said second switching signal for said lower-level circuit.

2. A semiconductor integrated circuit as claimed in claim 1,
  wherein said first control transistor has a threshold voltage equal to that of said P-channel MIS field effect transistor of said logical circuit; and
  wherein said second control transistor has a threshold voltage equal to that of said N-channel MIS field effect transistor of said logical circuit.

3. A semiconductor integrated circuit as claimed in claim 1,
  wherein at least one of said first and said second potential clamp circuits comprises at least one diode.

4. A semiconductor integrated circuit as claimed in claim 1,
  wherein at least one of said first and said second potential clamp circuits comprises at least one resistor.

5. A semiconductor integrated circuit as claimed in claim 1,
  wherein said first potential clamp circuit comprises at least one MIS field effect transistor reversed in channel type from said first control transistor, and
  wherein said second potential clamp circuit comprises at least one MIS field effect transistor reversed in channel type from said second control transistor.

* * * * *